United States Patent
Adamian

(10) Patent No.: US 7,068,049 B2
(45) Date of Patent: Jun. 27, 2006

(54) METHOD AND APPARATUS FOR MEASURING A DEVICE UNDER TEST USING AN IMPROVED THROUGH-REFLECT-LINE MEASUREMENT CALIBRATION

(75) Inventor: Vahe Adamian, Westlake Village, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 324 days.

(21) Appl. No.: 10/635,395

(22) Filed: Aug. 5, 2003

(65) Prior Publication Data

US 2005/0030047 A1 Feb. 10, 2005

(51) Int. Cl.
*G01R 27/04* (2006.01)
*G01R 27/28* (2006.01)

(52) U.S. Cl. .................................. 324/638; 324/612
(58) Field of Classification Search ................ 324/601, 324/638, 650, 612; 333/17.1; 702/118, 702/65, 2; 703/57
See application file for complete search history.

(56) References Cited

U.S. PATENT DOCUMENTS

| | | | |
|---|---|---|---|
| 4,816,767 A * | 3/1989 | Cannon et al. | 324/601 |
| 4,853,613 A * | 8/1989 | Sequeira et al. | 324/601 |
| 5,434,511 A | 7/1995 | Adamian et al. | |
| 5,467,021 A | 11/1995 | Adamian | |

(Continued)

OTHER PUBLICATIONS

Ferrero et al., "A New Implementation of a Multiport Automatic Network Analyzer", IEEE Transactions on Microwave Theory and Techniques, vol. 40, No. 11, Nov. 1992.

(Continued)

*Primary Examiner*—Vincent Q. Nguyen
*Assistant Examiner*—Jeff Natalini
(74) *Attorney, Agent, or Firm*—June L. Bouscaren

(57) ABSTRACT

A method of measuring a DUT provides a vector network analyzer with at least two measurement ports and measures characteristics of thru, reflect, and line calibration standards at the measurement ports. Error coefficients are calculated as well as a shifted electrical length attributable to the measured calibration standards. S-parameters of the DUT are measured and corrected based upon the error coefficients. A reference plane is shifted for each element of the corrected S-parameter matrix to a measurement reference plane, and $$\frac{\Gamma_{SA\_portn}}{\Gamma_{LA\_portm}} = S_{21\_thru\_nm} S_{12\_thru\_nm}$$

wherein $S_{21\_thru\_nm}$ is equal to $S_{12\_thru\_mn}$ and an argument of both solutions for $S_{21\_thru\_nm}$ is fit to a straight line, the solution having a y-intercept closest to zero being a correct solution and a resulting argument of the correct solution being the electrical delay.

5 Claims, 19 Drawing Sheets

U.S. PATENT DOCUMENTS

| | | | |
|---|---|---|---|
| 5,548,221 A | 8/1996 | Adamian et al. | |
| 5,578,932 A | 11/1996 | Adamian | |
| 5,793,213 A * | 8/1998 | Bockelman et al. | 324/601 |
| 5,825,669 A | 10/1998 | Oldfield et al. | |
| 6,060,888 A * | 5/2000 | Blackham et al. | 324/601 |
| 6,081,125 A * | 6/2000 | Krekels et al. | 324/601 |
| 6,300,775 B1 | 10/2001 | Peach et al. | |
| 6,832,170 B1 * | 12/2004 | Martens | 702/65 |
| 2003/0173978 A1 | 9/2003 | Adamian et al. | |

OTHER PUBLICATIONS

Ferrero et al., "Accurate Coaxial Standard Verification By Multiport Vector Network Analyzer", IEEE MTT-S Digest, 1994.

Marks, "A Multiline Method of Network ANalyzer Calibration", IEEE Transactions on Microwave Theory and Techniques, vol. 39 No. 7, Jul. 1991.

Rytting, "Advances in Microwave Error Correction Techniques", RF&Microw ave Meausrement Symposium and Exhibition, Jun. 1987.

Rytting, "Netw ork Analyzer Error Models and Calibration Methods", date unknown.

Ferrero, "Two-Port Netw oprk Analyzer Calibration Using an Unknow n Thru", IEEE Microw ave and Guided W ave LEtters, vol. 2, No. 12, Dec. 1992.

* cited by examiner

METHOD AND APPARATUS FOR MEASURING A DEVICE UNDER TEST USING AN IMPROVED THROUGH-REFLECT-LINE MEASUREMENT CALIBRATION

BACKGROUND

U.S. patent application Ser. No. 10/294,317 filed Nov. 14, 2002 entitled "Method and Apparatus for Performing Multiport Thru-Reflect-Line Calibration and Measurement" (herein "the '317 Patent Application") teaches a method and apparatus for performing a thru-reflect-line calibration with a multiple port vector network analyzer ("VNA"). The disclosed method teaches determination of ten-term error coefficients that may be used in a method disclosed in U.S. Pat. No. 5,434,511 (herein "the '511 Patent") to arrive at S-parameters of a device under test (herein "the DUT") with systematic errors attributable to the VNA and the multiport test set corrected out of the measured S-parameters of the DUT. In the method according to the '317 Patent Application, it is necessary to know a type of high reflect calibration standard used in the process. Also, in the method disclosed in the '317 Patent Application, if the thru calibration standard used in the calibration procedure is a non-zero thru, then its electrical length must be known and specified by the calibration standard manufacturer in order to fully characterize the error coefficients in the calibration process. In many cases, the electrical length of the non-zero thru is either unknown, not known to a sufficient accuracy, or is a non-repeatable value. A thru calibration standard is typically unknown for on-wafer calibrations because the landing of the probe to the calibration standard is non-repeatable, which renders the electrical length also non-repeatable, and therefore, unpredictable. Even though manufacturers of coaxial calibration standards often include electrical length data, over time and after multiple uses, the electrical length can change making a calibration process that relies on the electrical length specifications, less accurate. Due to machining, process, and other non-repeatable manufacturer variations, the manufacturer specifications of the thru calibration standards may not be as accurate as the calibration and measurement presumes. In addition, frequent use of the calibration standard can cause the dimensions and, therefore, the calibration specifications to change over time while the calibration process presumes otherwise. In high frequency on-wafer measurements, a non-zero thru is used exclusively. Furthermore, in an on-wafer calibration process, it is difficult to land probes repeatably on a calibration substrate to coincide with the electrical delay value provided by the calibration standard manufacturer. Any discrepancy between the actual electrical delay and the presumed electrical delay causes uncertainties in the calibration and, therefore, the corrections made to the measurement of a device under test ("DUT"). The uncertainties are exacerbated as measurement frequencies increase.

There is a need, therefore, to improve the thru-reflect-line calibration process to accommodate a thru calibration standard with an unknown delay or an unknown type of high reflect calibration standard with a known phase offset.

DETAILED DESCRIPTION

U.S. Pat. No. 5,434,511 entitled "Electronic Microwave Calibration Device" (herein "the '511 Patent") teaches a method for correcting measured S-parameters to arrive at actual S-parameters for a measured device. The method uses twelve error terms calculated from a short-open-load ("SOLT") calibration process. As one of ordinary skill in the art appreciates, a thru-reflect-line ("TRL") calibration process is also able to determine the twelve error terms from which actual S-parameters are determined based upon measured S-parameters of a device under test. The twelve error terms are: (1) forward directivity ("EDF"), (2) forward source match ("ESF"), (3) forward reflection tracking ("ERF"), (4) forward isolation ("EXR"), (5) forward load match ("ELF"), (6) forward transmission tracking ("ETF"), (7) reverse directivity ("EDR"), (8) reverse source match ("ESR"), (9) reverse reflection tracking ("ERR"), (10) reverse isolation ("EXR"), (11) reverse load match ("ELR"), and (12) reverse transmission tracking ("ETR"). Because the isolation of the switches used in a multiport test set is so high, it is more accurate in most circumstances to ignore the forward isolation ("EXF") and reverse isolation ("EXR") terms and set them to zero. This yields a 10-term error correction process. The TRL calibration process is more time consuming, but has the capability for more accurate measurements. More accurate measurements yield improved error terms and improved corrected S-parameters. The following discussion is directed toward multiple embodiments of an improved TRL calibration, DUT measurement, and S-parameter correction process.

Figure 1:
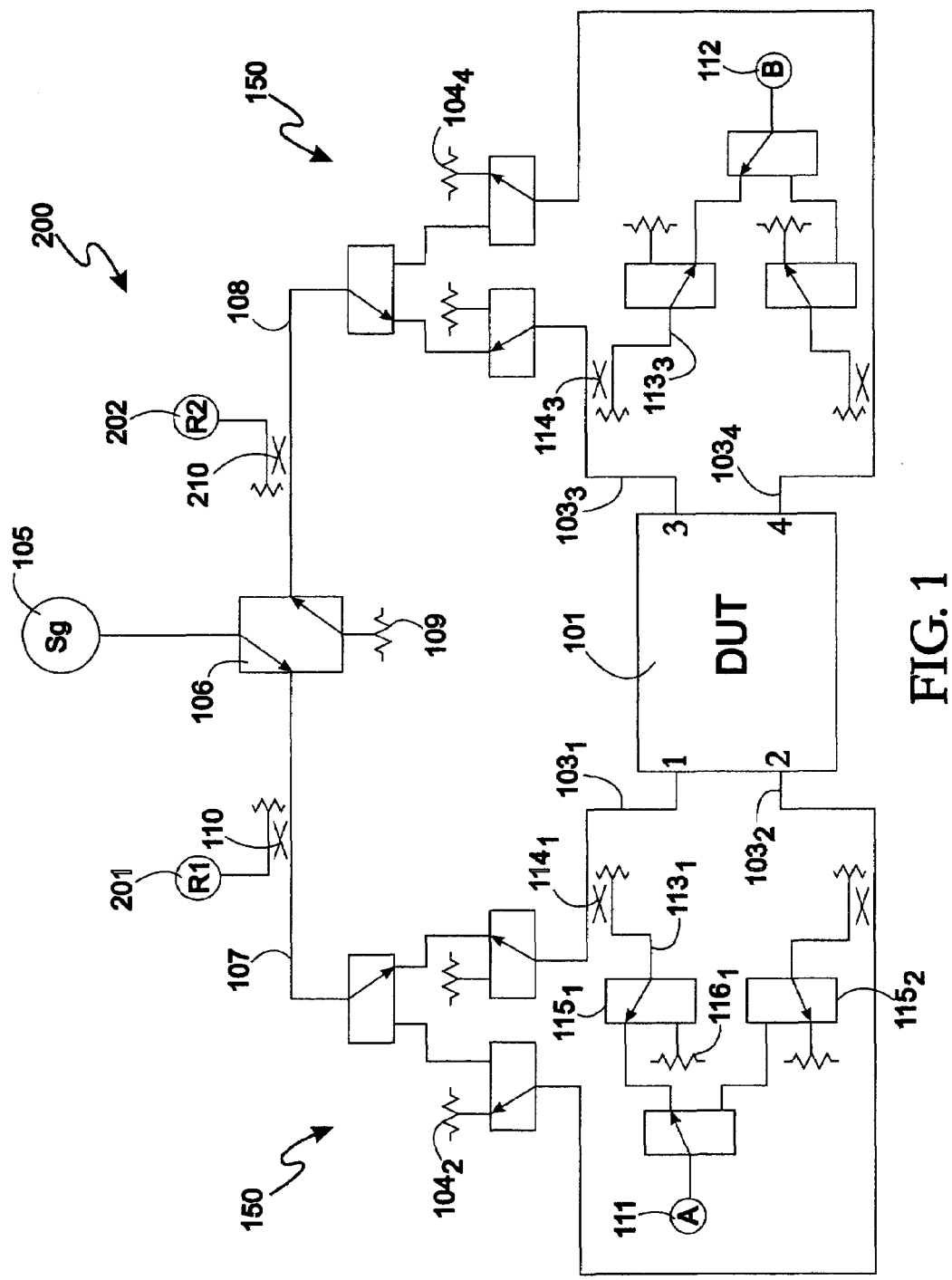
FIG. 1 is a diagram of a vector network analyzer ("VNA"), switch network and signal separation devices used for measurement of a device under test ("DUT").

With specific reference to FIG. 1 of the drawings, there is shown a system block diagram of a 2-port VNA 200 in conjunction with a 4-port test set. The illustrated 4-port test set comprises a switch network 150 and two external signal separation devices $114_2$ and $114_4$, which may be used with a 2-port VNA 200 for measuring a 4-port device under test 101 (herein "the DUT"). Alternative embodiments of test sets 150 having additional switches and signal separation devices may be used for measuring DUTs having more than 4 ports. For purposes of the present disclosure, the term "vector network analyzer (VNA) 200" refers to either a two port VNA alone, a 2-port VNA with a multiport test set for calibrating and measuring devices with more than 2 ports, or a multiport VNA. Before the DUT 101 is connected, a TRL calibration process is performed to determine systematic errors to a measurement as a result of the VNA 200 and associated connections. The VNA 200 deploys first and second reference channels 201, 202, respectively, and first and second reference channel samplers 110, 210, respectively. In the test set-up shown in FIG. 1, the samplers 110, 210 in a specific example may be bridges or directional couplers. The reference channel samplers 110, 210 are placed in the first and second signal paths 107, 108 on an opposite side of a signal transfer switch 106 from signal generator 105. The samplers 110, 210 extract in one direction a small and predictable portion of the signal present on the first and second signal paths 107, 108 for measurement by the first and second reference channels 201, 202, respectively. The sampled portion is typically −10 dB to −20 dB for a coupler based sampler and approximately −6 dB for a bridge based sampler relative to the signal level on the signal path 107 or 108. The source transfer switch 106 connects either the signal generator 105 to the first signal path 107 and a signal transfer switch terminating load 109 to the second signal path 108 or connects the signal generator 105 to the second signal path 108 and connects the signal transfer switch terminating load 109 to the first signal path 107. In a specific embodiment, there are only two switch positions for the signal transfer switch 106.

The illustrative example shown in the drawings and described herein includes a 4-port DUT 101 connected to measurement ports $103_1$, $103_2$, $103_3$, and $103_4$. The teachings herein disclose process details for calibrating ports $103_1$ and $103_3$. The disclosed process is repeated for all remaining ports. The present teachings may also be applied to a multiport test set-up for measuring DUTs having two or four or more device connections. A switch network 150 permits connection of each measurement port $103_1$ through $103_{2N}$ to a first or second signal path 107, 108, the transfer switch terminating load 109, or to a local terminating impedance, $104_1$ through $104_{2N}$. Certain switch network configurations connect one of the measurement ports 103 to the first signal path 107 or/and a different one of the measurement ports 103 to the second signal path 108 while the remaining paths are terminated in the local terminating impedance 104. The switch network 150 also has sampling arms 113, sampling arms $113_1$ through $113_4$ in the illustrated embodiment. The sampling arms $113_1$ through $113_4$ each comprise a sampler 114 that samples a small and predictable portion of the signal level present at the respective measurement port 103. The sampler 113 may be a coupler or a bridge that takes somewhere between −6 dB and −20 dB of the signal level from the signal level present on the respective measurement port 103. In a specific embodiment according to the present teachings, the portion sampled from the measurement ports 103 is substantially the same portion sampled from the signal paths 107, 108. The sampled signal may then be connected to either a first or second test channel receiver 111, 112 through a respective sampling switch 115 or may be connected to a sampling arm terminating load 116. A switch network 150 of this configuration may connect a reflection path from the measurement ports 103 to one of first and second test channel receivers 111, 112 while terminating the reflection paths from measurement ports 103 not connected to a test channel receiver in a local sampling arm terminating impedance 116.

In an embodiment of a method according to the present teachings, a TRL calibration on a multi-port DUT having N device connections is performed by conducting a 2-port TRL calibration first on each one of N/2 direct pairs of the measurement ports 103 and if there are more than two measurement ports, on (N(N−2))/4 indirect pairs of the measurement ports 103. A user may define the N/2 direct pairs by representing all measurement ports 103 in groupings of two measurement ports 103, where a first port in the direct pair is capable of connection to the first test channel receiver 111 and a second port in the direct pair is capable of connection to the second test channel receiver 112. As an example, if there are N measurement ports, the direct pairs of measurement ports are measurement ports $103_1$ and $103_{N/2+1}$, measurement ports $103_2$ and $103_{N/2+2}$, et seq. up to the direct pair of measurement ports $103_{N/2}$ and $103_N$ where measurement ports $103_1$ through $103_{N/2}$ are capable of connection to the first test channel receiver 111 and measurement ports 103 $_{(N+1)/2}$ through $103_N$ are capable of connection to the second test channel receiver 112.

There are (N(N−2))/4 indirect pairs, which are defined as those unique groupings of two measurement ports 103 that are not represented in the set of direct pairs of measurement ports and where a first measurement port in the indirect pair is capable of connection to the first test channel receiver 111 and the second measurement port in the indirect pair is capable of connection to the second test channel receiver 112. In the illustrated example, there are two direct pairs: first direct pair comprising measurement ports $103_1$ and $103_3$ and second direct pair comprising measurement ports $103_2$ and $103_4$. Also in the specific example, there are two indirect pairs: first indirect pair comprising measurement ports $103_1$ and $103_4$ and second indirect pair comprising measurement ports $103_2$ and $103_3$. Measurement ports 103 capable of connection to the same test channel receiver, either the first test channel receiver 111 or the second test channel receiver 112, are herein referred to as "proximal pairs". An N-port DUT has N(N−2)/4 unique proximal pairs of measurement ports 103. In the specific illustrated embodiment having four measurement ports, the proximal pairs are measurement ports $103_1$ and $103_2$, measurement ports $103_3$ and $103_4$.

Figure 2:
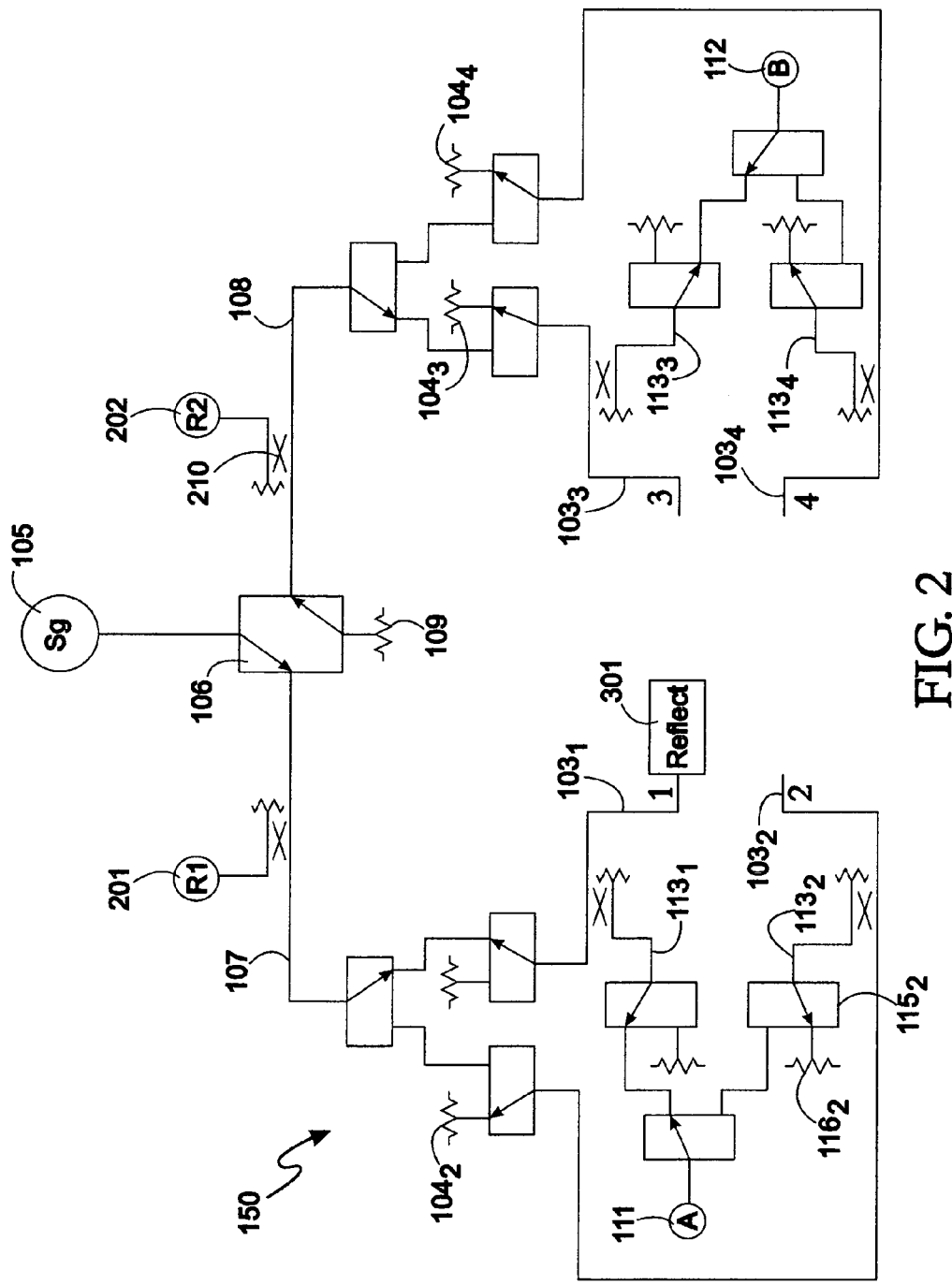
FIG. 2 shows the VNA with a reflect calibration standard connected.

In the TRL calibration process and with specific reference to FIG. 2 of the drawings, a high reflect calibration standard 301 ("the reflect 301") is measured at all measurement ports 103. The reflect 301 may be either a short or an open circuit with or without an offset. In one embodiment of the process, it is not necessary to know the type of reflect standard used, but it is important to know the phase offset of the reflect 301 in order to calculate an electrical length of a thru calibration standard. In an alternative embodiment, it is not necessary to know the type of reflect or the phase offset of the reflect calibration standard as long as the electrical length of the thru calibration standard is known. In the illustrated example, the reflect 301 is connected to measurement port $103_1$. The switching network 150 is set so the measurement port $103_1$ is connected to the first signal path 107 and the respective sampling arm $113_1$ is connected to the first test channel receiver 111. All remaining unused measurement ports $103_2$, $103_3$ and $103_4$ are terminated in their respective local terminating loads 104 and their respective sampling arms 113 are connected to the sampling arm terminating loads $116_2$, $116_3$, and $116_4$. As one of ordinary skill in the art appreciates, for measurement of the measurement port $103_1$ only the switch network configuration that terminates in a characteristic impedance for those measurement ports 103 that are capable of connection to the first test channel receiver 111 are important to the results. Because the isolation of the switches that comprise the switch network 150 is so high, the measurement ports 103 capable of connection to the second test channel receiver 112 do not figure in the high reflect measurement that uses the first test channel receiver 111. Similarly, the measurement ports 103 capable of connection to the first test channel receiver 111 do not figure in the high reflect measurement that uses the second test channel receiver 112. The signal generator 105 is then swept through a desired frequency range as programmed by an operator and measurements are taken at specific frequencies across the range. During the frequency sweep the VNA 200 measures a reference signal as well as a reflected signal and stores a ratio of the measured reflected signal level at the test channel receiver, 111 in the example, over the measured signal level at the reference receiver, 201 in the example. The system stores a resulting ratio, which is a frequency dependant reflection coefficient, herein referred to as a high reflect characteristic for measurement port $103_1$.

$A_{reflect\_1}/R1_{reflect\_1}$

The same process of measuring the reflect 301 is repeated for each measurement port 103. For each measurement port, the switch network 150 is configured so that the measurement port 103 with the reflect 301 receives the stimulus signal 105 and the switch network 150 has a sampling arm 113 arrangement whereby the reflected signal is measured by the appropriate test port 111 or 112. The unused measurement ports 103 are terminated in the local characteristic impedance 104 in the switching network 150. The sampling arms 113 of the unused measurement ports 103 are also terminated in the respective sampling arm terminating loads 116. The signal generator 105 stimulates the appropriate signal path 107 or 108 with a signal that is swept over the same desired frequency range as in the reflection measurement of measurement port $103_1$. The VNA 200 measures and stores a measurement of a ratio of the measured stimulus signal level over measured reflection signal yielding a frequency dependent array of reflected signal level over the stimulus signal, either $A_{reflect\_n}/R1_{reflect\_n}$ or $B_{reflect\_n}/R2_{reflect\_n}$, where "n" refers to the measurement port 103.

Figure 3:
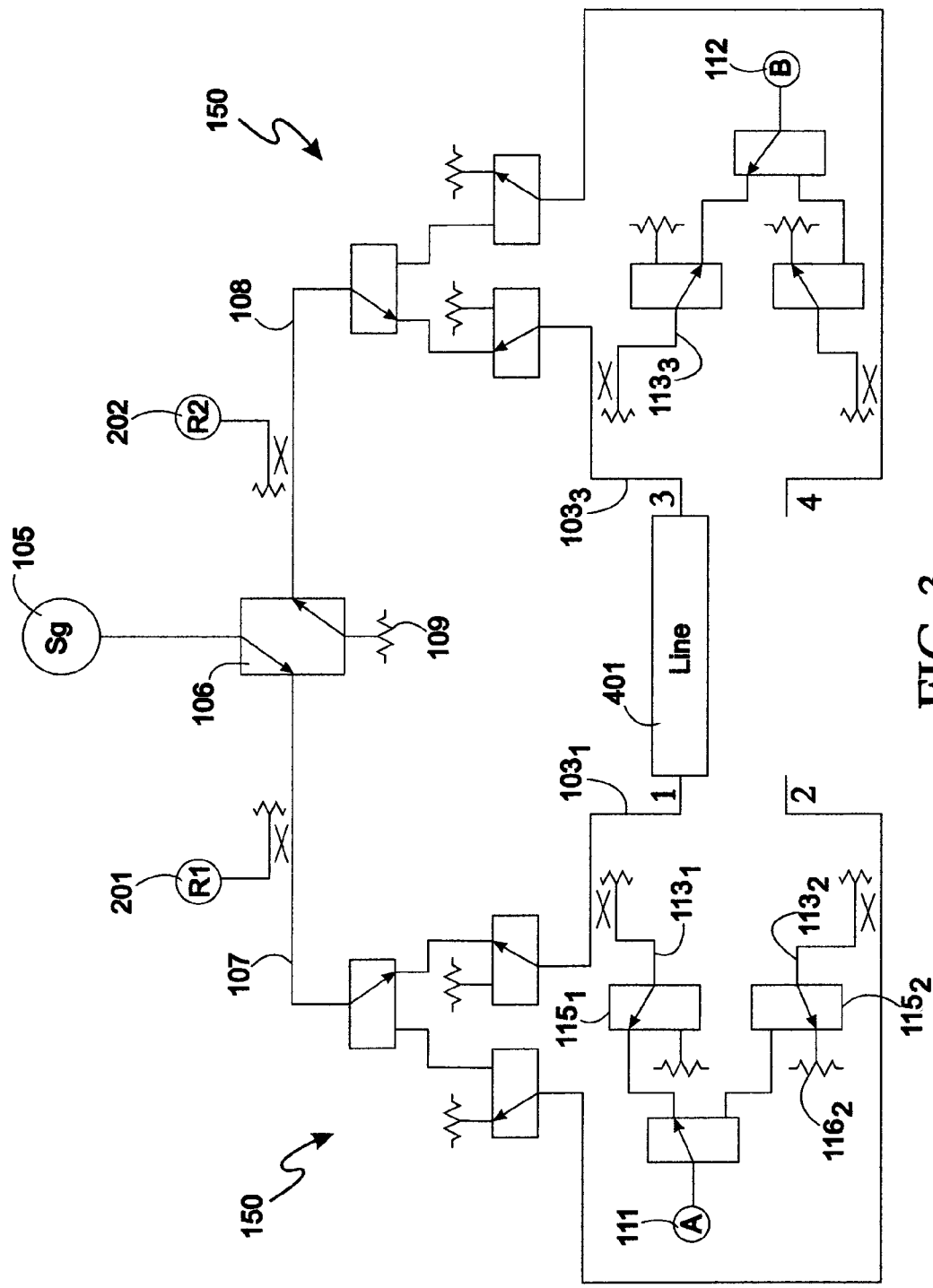
FIGS. 3 and 4 show the VNA with a line calibration standard connected and respective switch network configurations for forward and reverse measurements.

With specific reference to FIG. 3 of the drawings, a next step in the calibration process connects and measures a low-loss delay line calibration standard 401 ("the line 401") between each direct pair and indirect pair of measurement ports 103. The line 401 may be an airline i.e. a delay line having an air dielectric, which is commonly used in metrology laboratories. Alternatively and as typical for on-wafer measurements, a delay line may be used. The delay of the line 401 is unknown, but the physical dimensions of the line 401 relate to a valid range of calibration frequencies. Additional delay line calibration standards can be used to cover a broader frequency range as desired. The delay of the line 401 is defined over a range of frequencies bounded by approximately more than 20 degrees phase shift at a lowest specified frequency and less than 160 degrees phase shift at a highest specified frequency. At frequencies around 500 MHz and below, coaxial airline dimensions become very large and not practical. To measure at the lower frequencies, and with specific reference to FIG. 5 of the drawings, two high-quality matched loads 501 ("the matched loads 501") are connected to each measurement port 103 of the direct or indirect pair being measured. The matched loads 501 are used for calibrating the VNA 200 in a frequency range down to the lowest VNA frequency. The resulting calibration values of the line 401 and the matched loads 501 are different, but the algorithmic formulations using the measured ratios are the same.

With specific reference to FIG. 3 of the drawings in which the line 401 is measured between the first direct pair comprising measurement ports $103_1$ and $103_3$, the transfer switch 106 is set so that the signal generator 105 stimulates the first signal path 107 and the second signal path 108 is terminated at the source 109. The switch network 150 is configured so that the measurement port $103_1$ accepts the stimulus signal from the first signal path 107 and the signal from the sampling arm $113_1$ is presented to the first test port 111. The switch network 150 is further configured so that the measurement port $103_3$ is terminated in the transfer switch characteristic impedance 109 through second signal path 108 and a transmitted signal is presented to the second test port 112 through sampling arm $113_3$. The signal generator 105 sweeps the desired frequency range and the VNA 200 measures signal level from the first and second test channel receivers 111, 112 and the first and second reference receivers 201, 202 and stores the results in data arrays. For purposes of clarity and consistency only, when the signal generator 105 is connected to the first signal path 107, all resulting measurements are considered forward direction measurements. Accordingly, the measurements made of the line 401 in the forward direction are represented as the data arrays:

$A_{f\_line\_13}$,
$B_{f\_line\_13}$,
$R1_{f\_line\_13}$, and
$R2_{f\_line\_13}$.

where each array comprises a series of measured points at specific frequencies along the desired frequency range.

Figure 4:
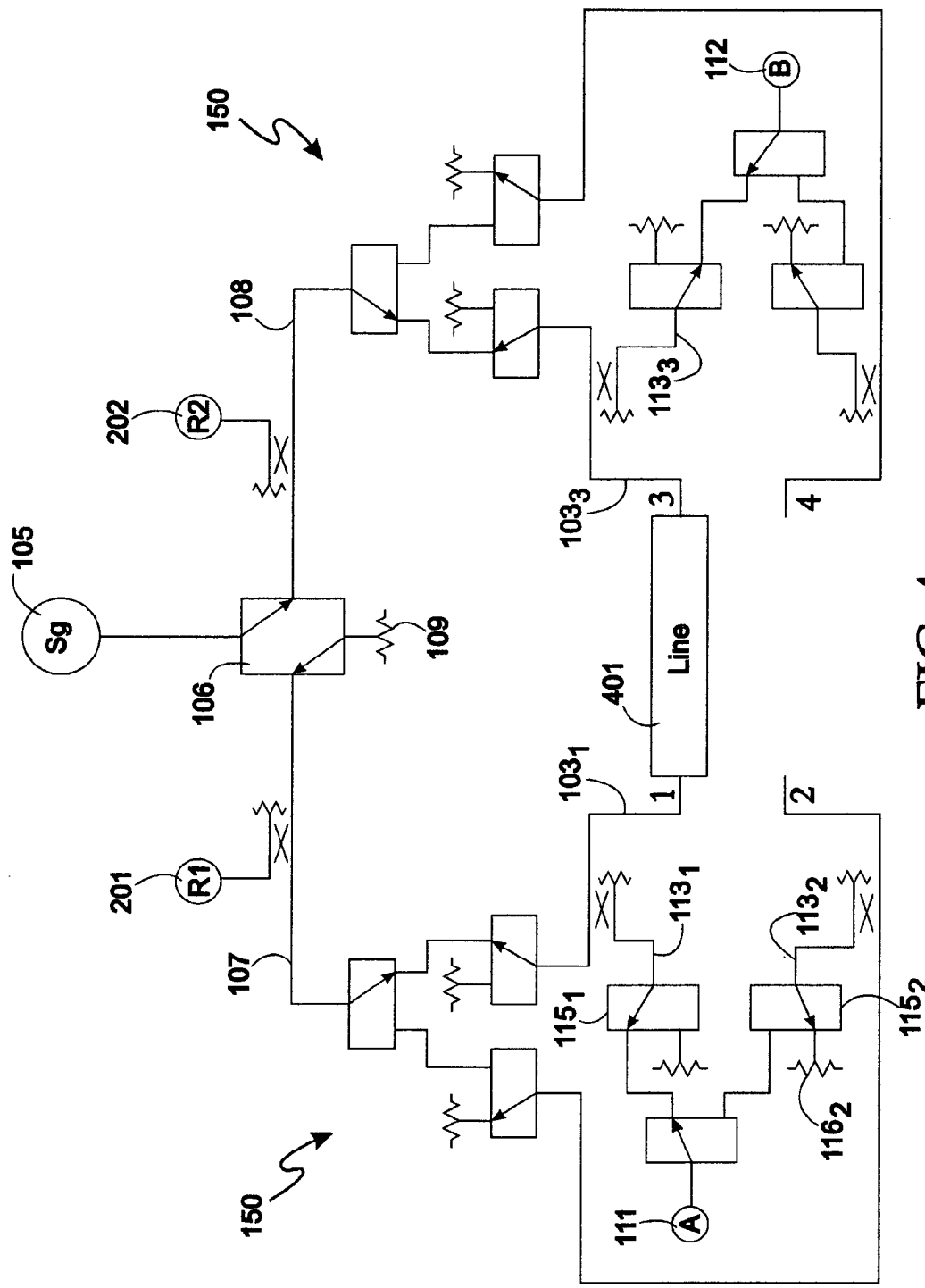

With specific reference to FIG. 4 of the drawings, the line 401 remains connected and the transfer switch 106 is reconfigured so that the signal generator 105 stimulates the second signal path 108 and the first signal path 107 is terminated in the transfer switch characteristic impedance 109 at the source. The configuration of the switch network 150 is not changed from the forward direction measurements. The signal generator 105 again sweeps the desired frequency range and the VNA 200 measures signal level from the first and second test channel receivers 111, 112 and the first and second reference receivers 201, 202 and stores them in data arrays. For purposes of clarity and consistency only, when the signal generator 105 is connected to the second signal path 108, all resulting measurements are considered reverse direction measurements. Accordingly, the measurements made of the line 401 in the reverse direction are represented as the data arrays:

$A_{r\_line\_13}$,
$B_{r\_line\_13}$,
$R1_{r\_line\_13}$, and
$R2_{r\_line\_13}$.

where each array comprises a series of measured points at specific frequencies along the desired frequency range.

Figure 5:
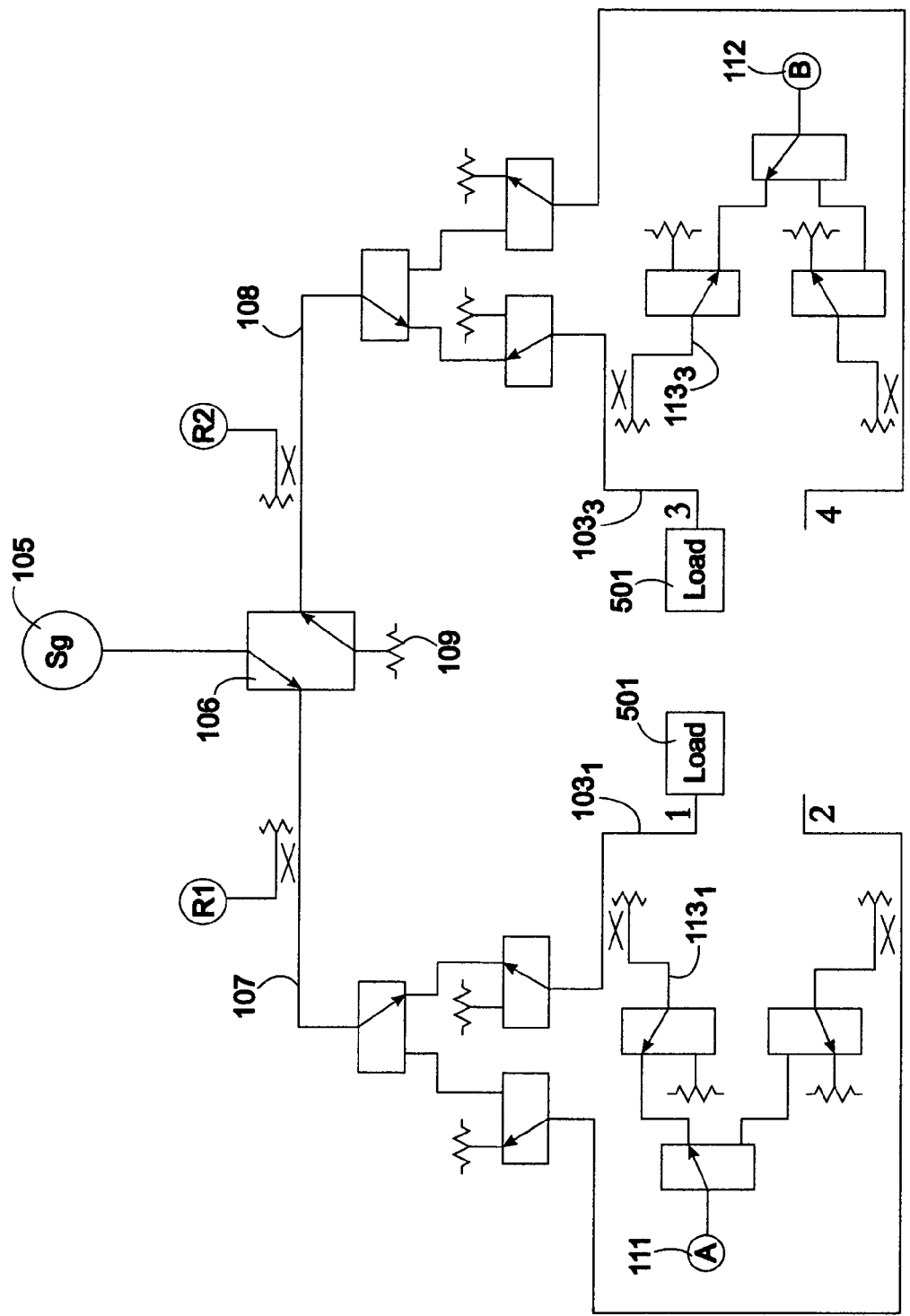
FIG. 5 shows the VNA with a matched load calibration standard connected.

If a broader frequency range is necessary, the same measurement procedure is performed on the first direct pair, measurement ports $103_1$ and $103_3$ in the specific embodiment, with a different airline covering a different frequency band. In addition, the matched loads 501 as shown in FIG. 5 of the drawings may be used to simulate a high loss line having a perfect match in order to take measurements at lower frequencies than are practical with an airline calibration standard. Depending upon the matched load, the quality of the match at higher frequencies, and the desired frequency range, the matched loads may be used in place of the airline calibration standard. As new measurements are made for the different frequency ranges using the appropriate calibration standards, the results are stored in the forward and reverse direction arrays with each data point corresponding to a specific stimulus signal frequency. Accordingly, the calibration frequency band can extend over more frequencies than is possible with a single airline calibration standard.

Figure 6:
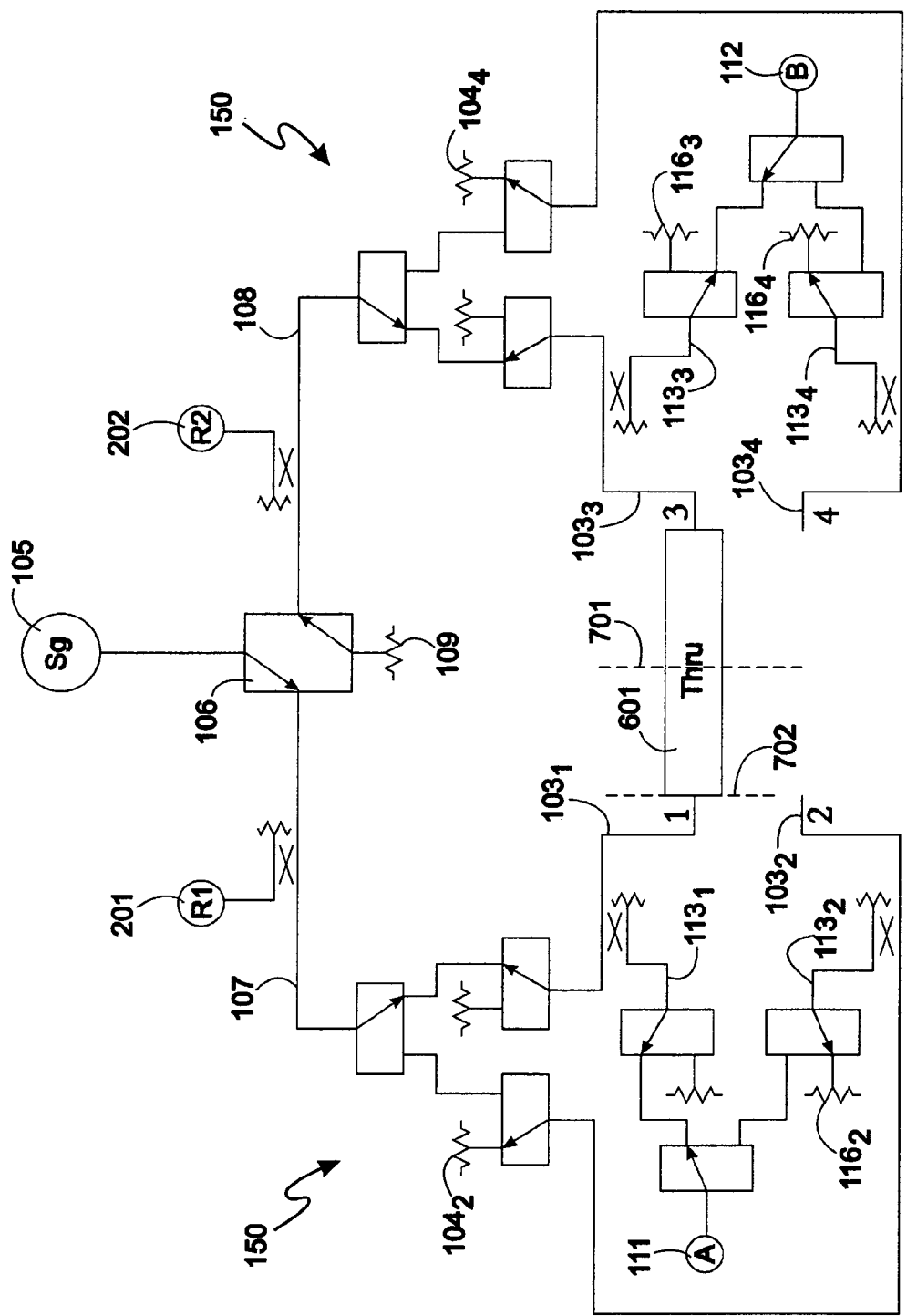
FIGS. 6 and 7 show the VNA with a source terminated thru calibration standard connected and respective switch network configurations for forward and reverse measurements.

With specific reference to FIG. 6 of the drawings, a next step in the calibration process is to connect and measure a source terminated thru calibration standard 601 ("the thru 601") between each direct pair and if there are more than two measurement ports 103, each indirect pair. The thru 601 may have either a zero length or a non-zero length and in one embodiment, it is not necessary that the electrical length be a known value. In an alternate embodiment, if the electrical length of the thru 601 is known, it is not necessary to know the phase offset of the high reflect calibration standard 301. For on-wafer measurements, it is not possible to obtain a high quality zero thru calibration standard. Accordingly, for on-wafer measurements, a non-zero thru calibration standard and zero offset high reflect calibration standard is typically used.

The first measurement of the thru 601 is made of a source terminated thru 601. Using the first direct pair as an example, the transfer switch 106 is set so that the signal generator 105 stimulates the first signal path 107 and the second signal path 108 is terminated in the transfer switch characteristic impedance 109. The switch network 150 is configured so that the measurement port $103_1$ accepts the stimulus signal from the first signal path 107 and the sampling arm $113_1$ is connected to the first test port 111. The switch network 150 is further configured so that the measurement port $103_3$ is terminated in the transfer switch characteristic impedance 109 through second signal path 108 and the sampling arm $113_3$ is connected to the second test port 112. The unused measurement ports 103 are terminated in the local characteristic impedances 104 and the unused sampling arms 113 are terminated in local sampling arm terminating loads 116. The signal generator 105 sweeps the desired frequency range and the VNA 200 measures the signal level from the first and second test channel receivers 111, 112 and the first and second reference receivers 201, 202 and stores the results in memory. According to the nomenclature used for purposes of the present disclosure, because the signal generator 105 is connected to the first signal path 107, the resulting measurements are considered forward direction measurements. Accordingly, the measurements made of the source terminated thru 601 in the forward direction are represented as the arrays:

$A_{fnm\_thru}$,
$B_{fnm\_thru}$,
$R1_{fnm\_thru}$, and
$R2_{fnm\_thru}$.

where each array comprises a series of measured points at specific frequencies along the desired frequency range and subscripts "n" and "m" refer to the measurement ports between which the thru 601 is connected where "m" is the source port and "n" is the receive port.

Figure 7:
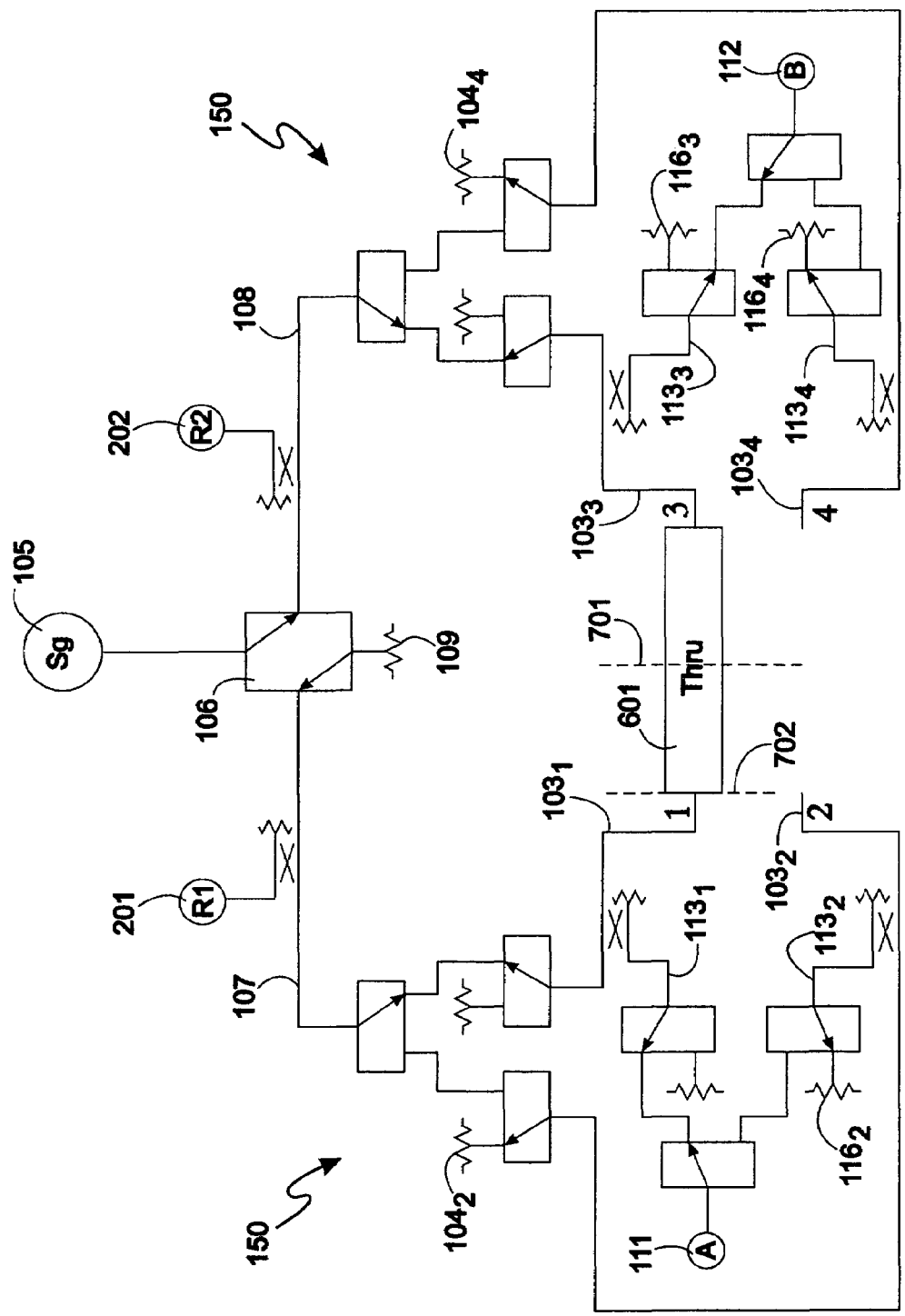

With specific reference to FIG. 7 of the drawings, the thru 601 remains connected and the transfer switch 106 is set for the reverse measurements. Specifically, the signal generator 105 stimulates the second signal path 108 and the first signal path is terminated in the transfer switch characteristic impedance 109. The switch network 150 is unchanged. The signal generator 105 again sweeps the desired frequency range and the VNA 200 measures a signal level from the first and second test channel receivers 111, 112 and the first and second reference receivers 201, 202 and stores them in memory. Because the signal generator 105 is connected to the second signal path 108, the resulting measurements are considered reverse direction measurements. Accordingly, the measurements made of the source terminated thru 601 in the reverse direction are represented as the arrays:

$B_{rnm\_thru}$,
$R1_{rnm\_thru}$, and
$R2_{rnm\_thru}$.

where each array comprises a series of measured points at specific frequencies along the desired frequency range.

At this point in the process, enough measurements have been taken to calculate forward and reverse directivity, source match and reflection tracking for all direct and indirect pairs. The present organization of the process, however, completes all measurements and then calculates all ten error terms for each direct, indirect, and proximal pairs of measurement ports. It is further possible with the measurements taken thus far to calculate an electrical length of the sum of the thru calibration standard 601 and zero or offset high reflect standard 301 that is used in the calibration process by extrapolating an argument of the reflection tracking term to DC. It is also possible to determine a type of high reflect standard used in the calibration process. Additional details of the specific error term and electrical length calculations are described herein.

Figure 8:
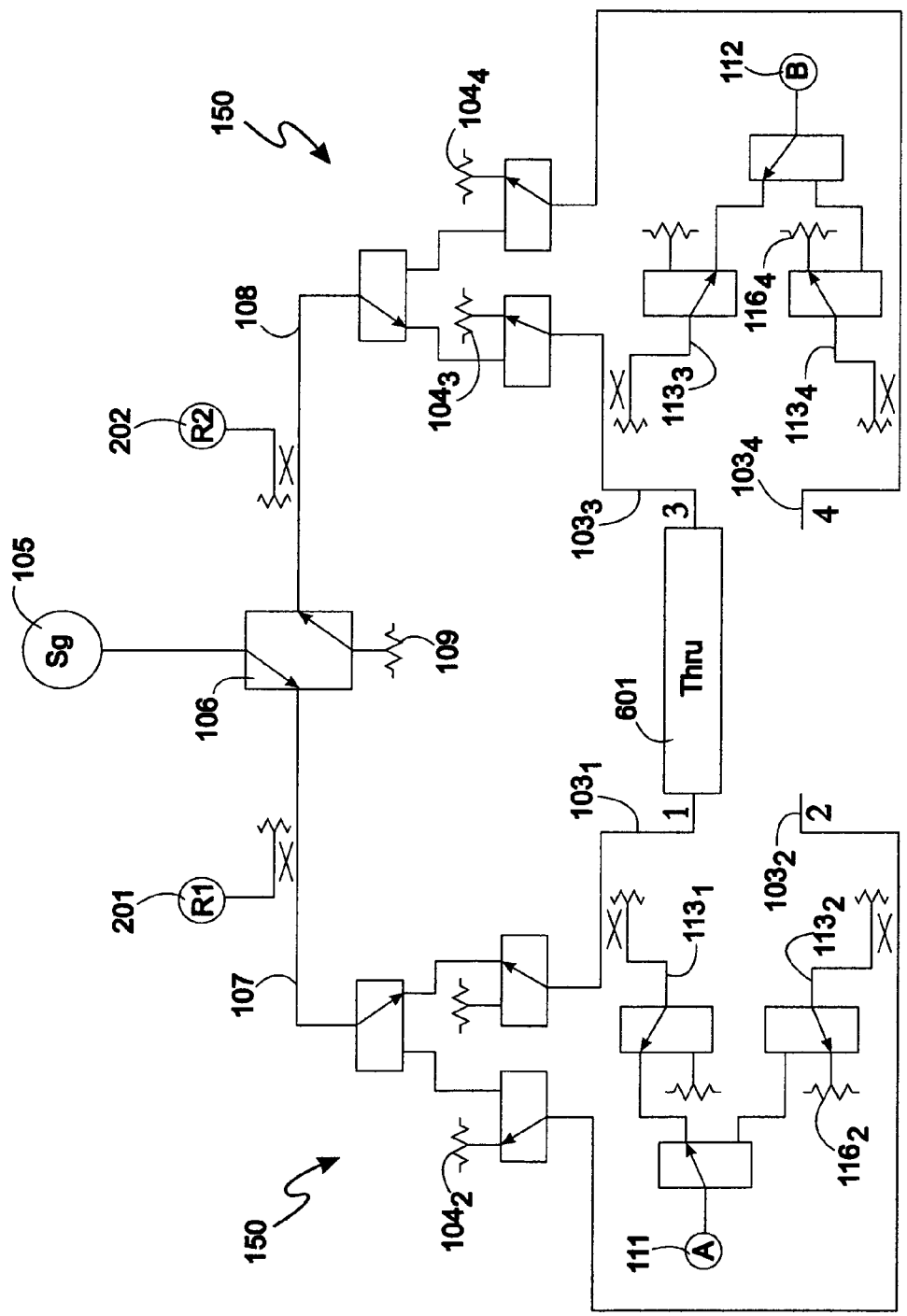
FIGS. 8 and 9 show the VNA with a locally terminated thru calibration standard connected and respective switch network configurations for forward and reverse measurements.

With specific reference to FIG. 8 of the drawings and with the thru 601 still connected, the transfer switch 106 is configured so that the signal generator 105 is in the first signal path 107 and the second signal path 108 is terminated in the characteristic impedance 109. The switch network 150 is configured so that the measurement port 103 is connected to the first signal path 107 and the respective sampling arm 113 is connected to the first test channel receiver 111. The remaining unused measurement ports 103 capable of connection to the first test channel receiver 111 are terminated at respective local characteristic impedances 104. In addition, the sampling arms 113 of the unused measurement ports 103 are terminated in local sampling arm characteristic impedances 116. The switch network 150 is further configured so that the measurement port 103 capable of connection to the second test channel receiver 112 in the first direct pair is terminated at the respective local characteristic impedance 104 and the respective sampling arm 113 is connected to the second test channel receiver 112. The measurement ports 103 of the direct pairs not being measured are also terminated in local characteristic impedances and the respective sampling arms 113 are terminated in respective local sampling arm terminating loads 116. The signal generator 105 is again swept through the desired frequency range and for each frequency point in the range, the VNA 200 measures a reflection response, a transmission response and a stimulus of the locally terminated thru 601 and stores the data in the following arrays:

$A_{fnm\_termthru}$,
$B_{fnm\_termthru}$, and
$R1_{fnm\_termthru}$.

Figure 9:
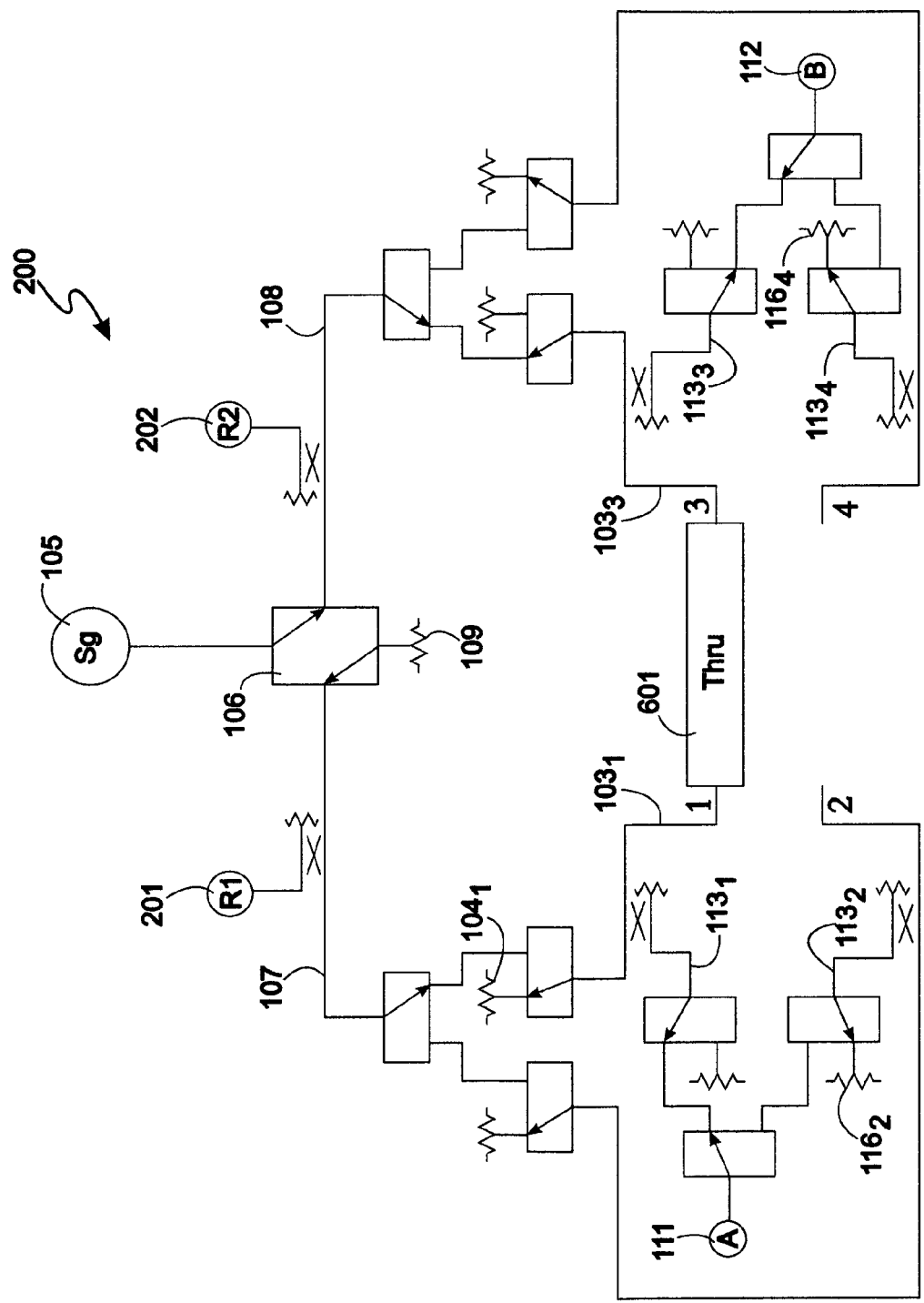

With specific reference to FIG. 9 of the drawings, and with the thru 601 still connected between the measurement ports 103 of the first direct pair, the transfer switch 106 is re-configured so that the signal generator 105 is in the second signal path 108 and the first signal path 107 is terminated in the characteristic impedance 109. The switch network 150 is also reconfigured so that the measurement port 103 in the first direct pair that is capable of connection to the second test channel receiver 112, measurement port $103_3$ in the illustrated example, is connected to the second signal path 108 and the respective sampling arm $113_3$ is connected to the second test channel receiver 112. The measurement port 103 in the first direct pair that is capable of connection to the first test channel receiver 111, measurement port $103_1$ in the illustrated example, is terminated in the respective local characteristic impedance $104_1$ and the respective sampling arm $113_1$ is connected to the first test channel receiver 111. The measurement ports 103 of the direct pairs not being measured are locally terminated in their characteristic impedances 104. Additionally, the sampling arms 113 of the unused measurement ports 103 are terminated in their respective local sampling arm terminating loads 116. The signal generator 105 is swept through the desired frequency range and for each frequency point in the range, the VNA 200 measures a reflection response of the locally terminated thru 601, a transmission response of the locally terminated thru 601, and the level of the stimulus signal as measured at the second reference channel 202. The measured values are stored in data arrays:

$A_{mm\_termthru}$,
$B_{mm\_termthru}$, and
$R2_{mm\_termthru}$.

The same process is followed to measure and record similar measurements of the thru 601 for all remaining direct pairs and indirect pairs of the measurement ports 103. It is preferred to measure the same frequency points for all calibration measurements along the frequency range so that each array has a corresponding measured value for each frequency point. It is acceptable, however, to interpolate the data to obtain a value for a specific frequency value as long as the frequency value is within the boundary of the lowest measured frequency and the highest measured frequency in the desired frequency range and the interval between measured frequencies is small enough to fully characterize the DUT including any resonances thereof. If multiple line calibration standards are used to obtain a broader frequency range, the measurements taken by the VNA 200 are stored in appropriate array elements in a larger array having an element for each frequency along the frequency range of interest. Accordingly, multiple steps of connecting calibration standards and making measurements may be performed to completely populate a single data array.

Figure 10:
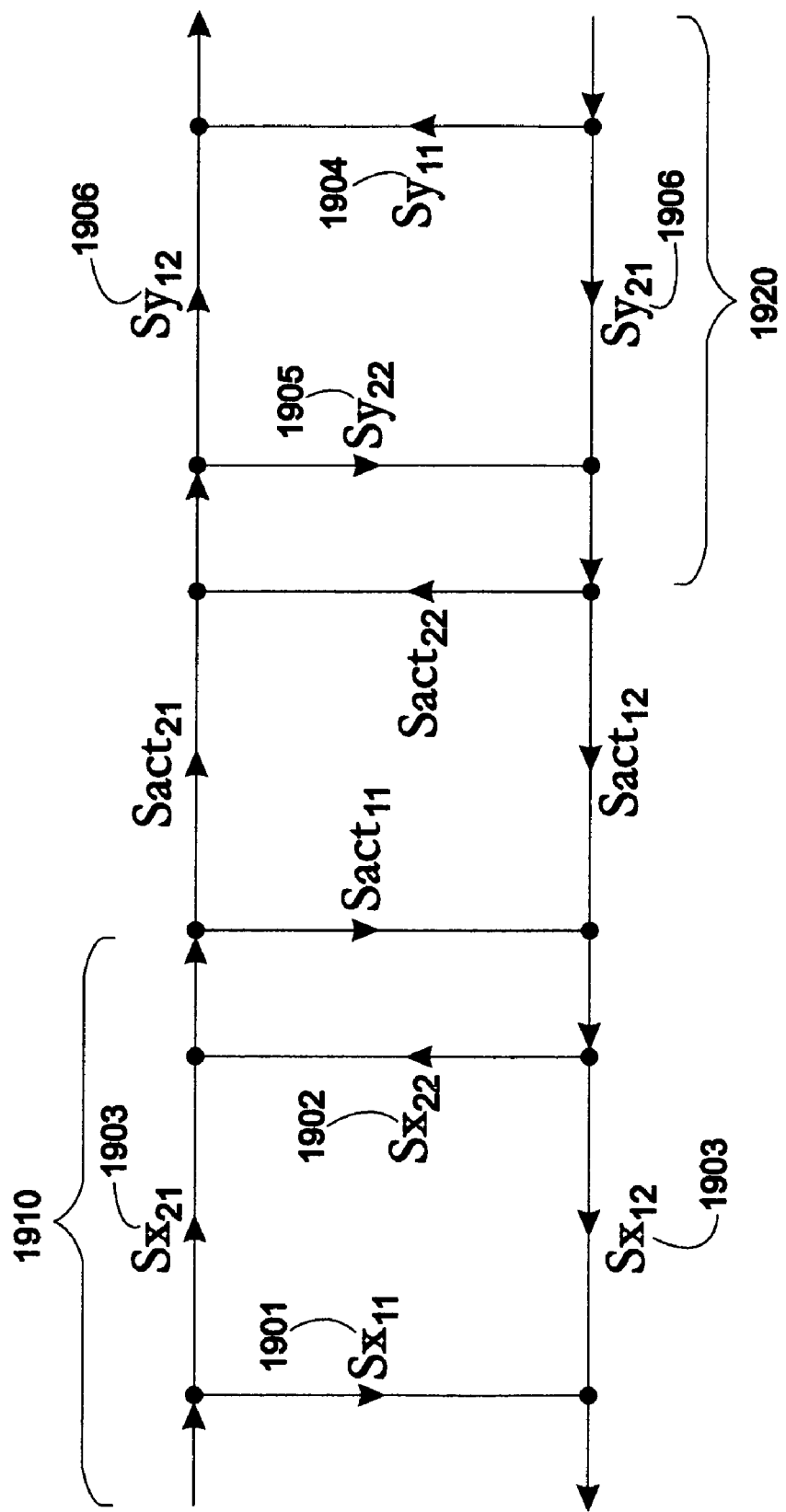
FIG. 10 is a flow diagram of some of the error coefficients determined in a method according to the present teachings.

With specific reference to FIG. 10 of the drawings, there is shown a flow graph between any first port and any second port of the VNA 200. A multiport embodiment has a similar calibration flow graph for each of the direct pairs. The calibration flow graph represents the forward directivity (shown as "EDF" in the '511 patent and $Sx_{11}$ in the present teachings) 1901, forward source match (shown as "ESF" in the '511 patent and $Sx_{22}$ in the present teachings) 1902, and forward reflection tracking error coefficients (shown as "ETF" in the '511 patent and $Sx_{12}Sx_{21}$ in the present teachings) 1903 for the X error adapter 1910. The calibration flow graph also represents reverse directivity (shown as "EDR" in the '511 patent and $Sy_{11}$ in the present teachings) 1904, reverse source match (shown as "ESR" in the '511 patent and $Sy_{22}$ in the present teachings) 1905, and reverse reflection tracking (shown as "ERR" in the '511 patent and $Sy_{12}Sy_{21}$ in the present teachings) error coefficients 1906 for the Y error adapter 1920. Not shown on the flow graph, but four remaining error coefficients that are also used in the ten term error correction process are forward transmission tracking (shown as "ETF" in the '511 patent and $\tau_{nm}$ in the present teachings where port "m" sources a stimulus and port "n" is the measurement port), forward load match (shown as "ELF" in the '511 patent and $\Gamma_m$ in the present teachings for port "m"), reverse transmission tracking (shown as "ETR" in the '511 patent and $\tau_{mn}$ in the present teachings where port "n" sources a stimulus and port "m" is the measurement port), and reverse load match (shown as "ELR" in the '511 patent and $\Gamma_n$ in the present teachings for port "n"). An embodiment of a method according to the present teachings determines the error coefficients for each direct and indirect pair based upon measurements of the TRL calibration standards for each direct and indirect measurement port pair. The flow graph represents an S-parameter matrix for the X error adapter 1910, $S_x$, which corresponds to a subset of the error artifacts for a first measurement port 103 in the direct or indirect pair, and an S-parameter matrix for the Y error adapter 1920, $S_y$, which corresponds to a subset of the error artifacts for a second measurement port 103 in the direct or indirect pair. The remaining error coefficients are calculated from the X and Y error adapter error artifacts.

S-parameter matrix $S_{act}$ represents the S-parameters of a calibration standard without the contribution of the X and Y error adapters. The S-parameter matrix of the X error adapter may be expressed as T-parameters using the following known conversion where port 1 represents a port from which a measurement is taken and port 2 represents a port that sources a stimulus signal:

$$Tx = \begin{bmatrix} Tx_{11} & Tx_{12} \\ Tx_{21} & Tx_{22} \end{bmatrix} = \begin{bmatrix} \dfrac{1}{Sx_{21}} & \dfrac{-Sx_{22}}{Sx_{21}} \\ \dfrac{Sx_{11}}{Sx_{21}} & \dfrac{Sx_{12}Sx_{21} - Sx_{11}Sx_{22}}{Sx_{21}} \end{bmatrix} \quad (1)$$

Accordingly, the matrix Sx may be converted into corresponding T-parameters expressed as Tx. If the matrix $T_{act\_thru}$ expresses the T-parameters of just the thru 601 and $T_{meas\_thru}$ expresses the T-parameters of the thru 601 as measured in context with the X and Y error adapters, then the following relationship holds true:

$$T_x T_{act\_thru} T_y = T_{meas\_thru} \quad (2)$$

Similarly, if the matrix $T_{act\_line}$ expresses the T-parameters of just the line 401 and $T_{meas\_line}$ expresses the T-parameters of the line 401 as measured in context with the X and Y error adapters, then the following relationship holds true:

$$T_x T_{act\_line} T_y = T_{meas\_line} \quad (3)$$

If the following relationships are defined:

$$T_{act\_x} = T_{act\_line} T_{act\_thru}^{-1} \quad (4)$$

and $$T_{meas\_x} = T_{meas\_line} T_{meas\_thru}^{-1} \quad (5)$$

then the following equation can be written:

$$T_x T_{act\_x} = T_{meas\_x} T_x \quad (6)$$

The thru 601 and the line 401 are each assumed to be perfectly matched. Therefore, the value of their reflection coefficient in the respective actual S-parameter matrix is set to zero. If the thru 601 has a non-zero length transmission coefficient, it is defined by $S_{21\_thru} = S_{12\_thru}$. The line 401 has a transmission coefficient defined by $S_{21\_line} = S_{12\_line}$.

From equation (4), therefore $T_{act\_x}$ may be expressed as:

$$T_{act\_x} = \begin{bmatrix} \dfrac{S_{21\_thru}}{S_{21\_line}} & 0 \\ 0 & \dfrac{S_{21\_line}}{S_{21\_thru}} \end{bmatrix} \quad (7)$$

Measurements of the source thru 601 and the source terminated line 401, each provide eight frequency dependent arrays of measured and stored results. There are four thru forward reflection and transmission arrays and four thru reverse reflection and transmission arrays. The arrays of measured data for the source terminated thru 601 are used in an algorithmic formulation in the S-parameter domain to compensate for the presence of the signal transfer switch 106 prior to calculation of the $T_{meas\_x}$ matrix. The effect of the transfer switch 106 of the uncorrected measured S-parameter for the thru and line calibration standards, $S_{meas\_line}$ and $S_{meas\_thru}$, are corrected by the formulation given by:

$$S_{transferswitxh\_corrected} = \begin{bmatrix} \dfrac{\left(\dfrac{A_f}{R1_f} - \dfrac{A_r}{R2_r}\dfrac{R2_f}{R1_f}\right)}{\left(1 - \dfrac{R2_f}{R1_f}\dfrac{R1_r}{R2_r}\right)} & \dfrac{\left(\dfrac{A_r}{R2_r} - \dfrac{A_f}{R1_f}\dfrac{R1_r}{R2_r}\right)}{\left(1 - \dfrac{R2_f}{R1_f}\dfrac{R1_r}{R2_r}\right)} \\ \dfrac{\left(\dfrac{B_f}{R1_f} - \dfrac{B_r}{R2_r}\dfrac{R2_f}{R1_f}\right)}{\left(1 - \dfrac{R2_f}{R1_f}\dfrac{R1_r}{R2_r}\right)} & \dfrac{\left(\dfrac{B_r}{R2_r} - \dfrac{B_f}{R1_f}\dfrac{R1_r}{R2_r}\right)}{\left(1 - \dfrac{R2_f}{R1_f}\dfrac{R1_r}{R2_r}\right)} \end{bmatrix} \quad (8)$$

where $A_f$, $B_f$, $R1_f$ and $R2_f$ are the forward direction raw measurement data, i.e. when the signal transfer switch 106 is directing the signal generator 105 to the first signal path 107, and $A_r$, $B_r$, $R1_r$ and $R2_r$ are the reverse direction raw measurement data, i.e. when the signal transfer switch 106 is directing the signal generator 105 to second signal path 108. After using this correction, the relevant S-parameter matrices are $S_{measnm\_thru\_transferswitch\_corrected}$ and $S_{measnm\_line\_transferswitch\_corrected}$ where "n" and "m" represent the port numbers between which the respective calibration standards are measured.

Using the first direct pair as an example, measurement ports 103$_1$ and 103$_3$, a corrected S-parameter matrix of the thru 601 measured in cascaded combination with the X and Y error adapters for the first direct pair is expressed herein as $S_{meas13\_thru\_transferswitch\_corrected}$. The correction formulation shown in equation (8) uses the arrays: $A_{f13\_thru}$, $B_{f13\_thru}$, $R1_{f13\_thru}$, $R2_{f13\_thru}$, $A_{r13\_thru}$, $B_{r13\_thru}$, $R1_{r13\_thru}$, and $R2_{r13\_thru}$ to calculate $S_{meas13\_thru\_transferswitch\_corrected}$. Converting the $S_{meas13\_thru\_tranferswitch\_corrected}$ matrix to the corresponding T-parameters using equation (1) yields matrix $T_{meas13\_thru\_transferswitch\_corrected}$. To obtain the $S_{meas13\_line\_transferswitch\_corrected}$ matrix for the first direct pair, the correction formulation shown in equation (8) uses the arrays: $A_{f13\_line}$, $B_{f13\_line}$, $R1_{f13\_line}$, $R2_{f13\_line}$, $A_{r13\_line}$, $B_{r13\_line}$, $R1_{r13\_line}$, and $R2_{r13\_line}$. Converting the corrected $S_{meas13\_line\_transferswitch\_corrected}$ matrix to the corresponding T-parameters, yields matrix $T_{meas13\_line\_transferswitch\_corrected}$. The $T_{meas13\_thru\_transferswitch\_corrected}$ and $T_{meas13\_line\_transferswitch\_corrected}$ matrices are used in equations (4) and (5) to calculate $T_{act\_x}$ and $T_{meas\_x}$.

Referring now to the general case, $T_x$ is the T-parameter matrix for the X error adapter and is defined by its matrix elements as:

$$Tx = \begin{bmatrix} Tx_{11} & Tx_{12} \\ Tx_{21} & Tx_{22} \end{bmatrix} \quad (9)$$

$T_{meas\_x}$ is also defined by its matrix elements, and is represented as:

$$T_{meas\_x} = \begin{bmatrix} T_{meas\_x11} & T_{meas\_x12} \\ T_{meas\_x21} & T_{meas\_x22} \end{bmatrix} \quad (10)$$

From equation (5), $T_{meas\_x}$ for measurement ports 103$_1$ and 103$_3$, which is expressed as $T_{meas13\_x}$, is calculated using the $T_{meas13\_thru\_transferswitch\_corrected}$ and $T_{meas13\_line\_transferswitch\_corrected}$ matrices. Accordingly:

$$T_{meas13\_x} = T_{meas13\_line\_transferswitch\_corrected} T_{meas13\_thru\_transferswitch\_corrected}^{-1}$$

Using the relationship in equations (4), substituting the terms in equation (6), and eliminating the $S_{21\_thru}/S_{21\_line}$ term, the following general equation can be written:

$$\dfrac{Tx_{21}}{Tx_{11}} = \dfrac{\left(-T_{meas\_x11} + \sqrt{\dfrac{4T_{meas\_x12}T_{meas\_x21} +}{(T_{meas\_x11} - T_{meas\_x22})^2}} + T_{meas\_x22}\right)}{2T_{meas\_x12}} \quad (11)$$

and $$\dfrac{Tx_{22}}{Tx_{12}} = \dfrac{\left(-T_{meas\_x11} + \sqrt{\dfrac{4T_{meas\_x12}T_{meas\_x21} +}{(T_{meas\_x11} - T_{meas\_x22})^2}} + T_{meas\_x22}\right)}{2T_{meas\_x12}} \quad (12)$$

Based upon the T-parameter to S-parameter conversion, $$\dfrac{Tx_{21}}{Tx_{11}} \text{ and } \dfrac{Tx_{22}}{Tx_{12}}$$

in terms of the corresponding S-parameter error adapter matrix may also be expressed as:

$$\dfrac{Tx_{21}}{Tx_{11}} = Sx_{11} = B \quad (13)$$

and $$\dfrac{Tx_{22}}{Tx_{12}} = Sx_{11} - \dfrac{Sx_{12}Sx_{21}}{Sx_{22}} = A \quad (14)$$

As one of ordinary skill in the art can appreciate, equations (11) and (12) are equal. Because there is a square root in the solution, there are two possible mathematical solutions. The smaller valued solution, defined by B, corresponds to the directivity error coefficient, $S_{x11}$ 1901, of error adapter X. The larger valued solution, defined by A, is a mathematical combination of source match 1902 and reflection tracking 1903.

As mentioned before, at frequencies around 500 MHz and below, the dimensions of the line 401 become very large and not practical. Calculation of the directivity 1901 and the solution represented by A for the lower frequencies uses the measurements taken of the two high-quality matched loads 501 instead of the line 601. It is assumed that the matched loads 501 are perfectly matched to the measurement port and have a zero reflection coefficient. The same algorithmic formulations shown in equations (5) through (14) are used. To understand the usage of the measurement results from the two matched loads, note that the thru 601 has a non-zero-length transmission coefficient defined by $S_{12thru}=S_{12thru}$. The matched loads 501 have a transmission isolation coefficient defined by $S_{21load}=S_{12load}$. Due to the high isolation between the matched loads 501, $S_{21load}$ is close to a zero value. Accordingly, $S_{21load}$ is set to a very small, non-zero value, such as $10^{-10}$ in order to avoid division by zero ambiguity in the S-parameter to T-parameter conversion. From this, $T_{act\_x}$ at the lower frequencies can be calculated and is given by:

$$T_{act\_x} = \begin{bmatrix} \frac{S_{21\_thru}}{10^{-10}} & 0 \\ 0 & \frac{10^{-10}}{S_{21\_thru}} \end{bmatrix} \quad (15)$$

As shown before, by using equations (4) and (5), substituting results into equation (6) and eliminating the $S^{21}{}_{\_thru}/10^{-10}$ term, equations (11) and (12) are derived. The S-parameters from the matched loads 501 are corrected using equation (8) to yield $S_{meas13\_load\_transferswitch\_corrected}$, which is then converted using equation (1) to yield $T_{meas13\_load\_transferswitch\_corrected}$. The $T_{meas13\_load\_transferswitch\_corrected}$ term is used to calculate $T_{meas13\_x}$ in place of the terms measuring the line 401. The calculations in equations (11) and (12), therefore, are the same as for the line 401.

A similar process is performed to calculate terms in the error adapter Y. Beginning with equations (2) and (3) and defining the following relationships:

$$T_{act\_y}=T_{act\_thru}{}^{-1}T_{act\_line} \quad (16)$$

and $$T_{meas\_y}=T_{meas\_thru}{}^{-1}T_{meas\_line} \quad (17)$$

then the following equation can be written:

$$T_{act\_y}T_y=T_y T_{meas\_y} \quad (18)$$

With specific reference to FIG. 10 of the drawings, the known conversion for T-parameter matrix for the error adapter Y in terms of the S-parameters where port 1 is on the right and port 2 is on the left when looking at the DUT 101 is:

$$Ty = \begin{bmatrix} Ty_{11} & Tx_{12} \\ Ty_{21} & Ty_{22} \end{bmatrix} = \begin{bmatrix} \frac{1}{Sy_{12}} & \frac{-Sy_{11}}{Sy_{12}} \\ \frac{Sy_{22}}{Sy_{12}} & \frac{Sy_{12}Sy_{21}-Sy_{11}Sy_{22}}{Sy_{12}} \end{bmatrix} \quad (19)$$

Accordingly, the matrix Sy may be converted into corresponding T-parameters expressed as Ty. The $T_{meas13\_thru\_corrected}$ and $T_{meas13\_line\_corrected}$ matrices have already been calculated and are used in equation (17) to calculate $T_{meas13\_y}$, where:

$$T_{meas13\_y} = \begin{bmatrix} T_{meas13\_y11} & T_{meas13\_y12} \\ T_{meas13\_y21} & T_{meas13\_y22} \end{bmatrix} \quad (20)$$

Using equation (18), substituting the relationships in equations (16) and (17) and eliminating the $S_{21thru}/S_{21line}$ term, the following equation for the first direct pair can be written:

$$\frac{Ty_{12}}{Ty_{11}} = \frac{\left(-T_{meas13\_y11}+\sqrt{4T_{meas13\_y12}T_{meas13\_y21}+(T_{meas13\_y11}-T_{meas13\_y22})^2}+T_{meas13\_y22}\right)}{2T_{meas13\_y21}} \quad (21)$$

and $$\frac{Ty_{22}}{Ty_{21}} = \frac{\left(-T_{meas13\_y11}+\sqrt{4T_{meas13\_y12}T_{meas13\_y21}+(T_{meas13\_y11}-T_{meas13\_y22})^2}+T_{meas13\_y22}\right)}{2T_{meas13\_y21}} \quad (22)$$

From equation (19), $$\frac{Ty_{12}}{Ty_{11}} \text{ and } \frac{Ty_{22}}{Ty_{21}}$$

in terms of the corresponding the S-parameters for the error adapter Y is also given by:

$$\frac{Ty_{12}}{Ty_{11}} = -Sy_{11} = D \quad (23)$$

and $$\frac{Ty_{22}}{Ty_{21}} = \frac{Sy_{12}Sy_{21}}{Sy_{22}} - Sy_{11} = C \quad (24)$$

As one of ordinary skill in the art can appreciate, equations (21) and (22) are equal and because of the square root have two solutions. The smaller value or the first solution, defined by $Sy_{11}$, corresponds to the directivity error of the Y error adapter. The larger value or the second solution, defined by C, corresponds to the error coefficient, $$\frac{Sy_{12}Sy_{21}}{Sy_{22}} - Sy_{11},$$

for the Y error adapter.

With reference to the portion of the calibration procedure that measures the high reflect calibration standard as illustrated in FIG. 2 of the drawings, the high reflect standard 301, is connected to one measurement port $103_1$ of the first direct pair and the same high reflect standard 301 is disconnected from the measurement port $103_1$ and is then connected to the other measurement port $103_3$ of the first direct pair. With specific reference to FIG. 10 of the drawings the following equation can be written:

$$\Gamma_{meas\_reflect\_x} = Sx_{11} + \frac{Sx_{12}Sx_{21}\Gamma_{act\_reflect\_x}}{1 - Sx_{22}\Gamma_{act\_reflect\_x}} \quad (25)$$

where $\Gamma_{meas\_reflect\_x}$ is the measured reflection coefficient of the high reflect standard 301 at the measurement port capable of connection to the first test channel receiver, measurement port $103_1$ in the first direct pair, and $\Gamma_{act\_reflect\_x}$ is the actual reflection coefficient of the high reflect standard at the same measurement port $103_1$. The same high reflect calibration standard 301 is connected to the opposite port in the first direct pair, measurement port $103_3$ in the specific example. With respect to the error adapter Y, the following equation can also be written:

$$\Gamma_{meas\_reflect\_y} = Sy_{11} + \frac{Sy_{12}Sy_{21}\Gamma_{act\_reflect\_y}}{1 - Sy_{22}\Gamma_{act\_reflect\_y}} \quad (26)$$

where $\Gamma_{meas\_reflect\_y}$ is the measured reflection coefficient of the high reflect standard 301 at measurement port $103_3$ and $\Gamma_{act\_reflect\_y}$ is the actual reflection coefficient of the high reflect standard at the measurement port $103_3$. A value for the measured reflection coefficient of the high reflect standard, $\Gamma_{meas\_reflect\_x}$, for the measurement port $103_1$ may be obtained from the following measured and stored arrays $A_{reflect\_1}/R1_{reflect\_1}$. Similarly, a value for the measured reflection coefficient of the high reflect standard, $\Gamma_{meas\_reflect\_y}$, for the measurement port $103_3$ may be obtained from the following measured and stored arrays $B_{reflect\_3}/R2_{reflect\_3}$. Because the same high reflect standard is connected to measurement ports $103_1$ and $103_3$, it is possible to solve for $\Gamma_{act\_reflect\_x}$ in equation (25) and $\Gamma_{act\_reflect\_y}$ in equation (26), and set the $\Gamma$ terms equal to each other. From the resulting relationship and equations (13), (14), (23), (24), (25) and (26), the following relationship can be written:

$$Sx_{22} = \frac{(B - \Gamma_{meas\_reflect\_x})(C - \Gamma_{meas\_reflect\_y})Sy_{22}}{(A - \Gamma_{meas\_reflect\_x})(D - \Gamma_{meas\_reflect\_y})} \quad (27)$$

As one of ordinary skill in the art appreciates, equation (27) has two unknown terms, but permits the expression of $Sx_{22}$ in terms of $Sy_{22}$. Accordingly, another relationship is necessary in order to solve for these two unknown terms.

With specific reference to FIGS. 7 and 10, the following equation can also be written:

$$\Gamma_{meas\_thru11} = Sx_{11} + \frac{Sx_{12}Sx_{21}Sy_{22}}{1 - Sx_{22}Sy_{22}} \quad (28)$$

where $\Gamma_{meas\_thru11}$ is measured as $A_{f13\_thru}/R1_{f13\_thru}$ for the measurement port of the first direct pair that is capable of connection to the first test channel receiver 111. From (13), (14), (23) and (24), the following can be written:

$$Sx_{22} = \sqrt{\frac{(B - \Gamma_{meas\_reflect\_x})(C - \Gamma_{meas\_reflect\_y})(B - \Gamma_{meas\_thru11})}{(A - \Gamma_{meas\_reflect\_x})(D - \Gamma_{meas\_reflect\_y})(A - \Gamma_{meas\_thru11})}} \quad (29)$$

$Sx_{22}$ is the source match error coefficient at the first measurement port 103. Due to the square root function in equation (29), there are 2 possible solutions for $Sx_{22}$. Additional information is needed, therefore, to solve for the appropriate solution for the present measurement.

The reflection-tracking error coefficient $S_{x12}S_{x21}$ is calculated for each of the two possible solutions to yield:

$$S_{X12}S_{X21} = (B - A)S_{X22\_solution\_1} \quad (30)$$

and $$S_{X12}S_{X21} = (B - A)S_{X22\_solution\_2} \quad (31)$$

Squaring either equation (30) or (31) provides the complex value $(S_{x12}S_{x21})^2$. Because the square of the reflection-tracking coefficient is a complex variable, its square root has two solutions. Each of the two solutions has the same magnitude, but they are 180 degrees out of phase. Only one of the solutions is proper. To select the proper solution, both solutions for reflection tracking are solved at DC. Based upon the properties of reflection tracking, the argument of the proper solution is zero at DC. Given this boundary condition, therefore, the solution for reflection tracking with an argument closest to zero at a DC frequency is the proper solution and a value for the reflection tracking parameter may be determined.

Because S-parameter measurements are not taken at DC, the function that is fit to the argument of the reflection-tracking coefficient is extrapolated to a frequency value at DC. Specifically, the argument, θ, for each solution is calculated as a function of frequency. A first solution for the argument is represented as $θ(f)_{sx22\_solution1}$ and a second solution is represented as $θ(f)_{sx22\_solution2}$. For each solution, as the calculated function of frequency crosses through +180 or −180 degree points, 360 degrees is added to form a continuous function of phase as a function of frequency. Each resulting continuous function is fitted using a least sum squared fitting algorithm with a two term polynomial where f represents a frequency value and where:

$$\theta(f)_{sx22\_solution1} = \qquad (32)$$

$$\sum_{i=0}^{1} A_i f^i = A_{0\_sx22\_solution1} + A_{1\_sx22\_solution1} f$$

and $$\theta(f)_{sx22\_solution2} = \qquad (33)$$

$$\sum_{i=0}^{1} A_i f^i = A_{0\_sx22\_solution2} + A_{1\_sx22\_solution2} f$$

Each two term polynomial defines a straight line with slope, $A_{1\_sx22}$, and y-intercept, $A_{0\_sx22}$. The y-intercept represents a value of θ at DC. Of the two possible solutions for $A_{0\_sx22}$, only one of the solutions has a y-intercept of zero. Accordingly, whichever value, $A_{0\_sx22\_solution1}$ or $A_{0\_sx22\_solution2}$, is closest to a zero value is the proper solution. When the proper solution is identified, both the magnitude and phase are then calculated for the reflection tracking coefficient, $S_{x12}S_{x21}$. From the calculation of the reflection tracking coefficient, source match error, $S_{x22}$, is calculated where:

$$S_{X22} = \frac{S_{x12}S_{x21}}{B-A} \qquad (34)$$

The factors represented as "B" and "A" are known from equations (13) and (14). Accordingly, the source match error, $S_{x22}$, is also fully determinable.

When a value for $Sx_{22}$ is known, a value for $Sy_{22}$ may be calculated from equation (27). $Sy_{22}$ is the source match error coefficient of error adapter Y at the measurement port capable of connection to the second test channel receiver 112, which is measurement port $103_3$ in the specific example.

A definite value for $Sy_{22}$ and equations (23), (24) and (27) permit calculation of a reflection tracking for the error adapter Y and is given by:

$$Sy_{12}Sy_{21} = (D-C)Sy_{22} \qquad (35)$$

Accordingly, the directivity, source match and reflection tracking for the error adapter X and the error adapter Y for the first direct pair is determined. The same process is followed to calculate the directivity, source match, and reflection tracking for the X and Y error adapters for each direct and indirect pair. The X error adapters are defined as the error artifacts presented in series with the measurement ports 103 capable of connection to the first test channel receiver 111. Similarly, the Y error adapters are defined as the error artifacts presented in series with the measurement ports 103 capable of connection to the second test channel receiver 112.

In the specific four-port embodiment, the measurements and calculations described herein for measurement ports $103_1$ and $103_3$ yield directivity, source match and reflection tracking for the error adapter X related to measurement port $103_1$ and directivity, source match, and reflection tracking for the error adapter Y related to measurement port $103_3$. The same measurements and calculations described herein for measurement ports $103_1$ and $103_3$ are performed for the second direct pair and if source terminated measurements are taken for the indirect pairs, all indirect pairs as well. If source terminated measurements are not taken for the indirect pairs, directivity, source match, and reflection tracking are determined according to the teachings U.S. patent application Ser. No. 09/954,962 (herein "the '962 patent application"), the teachings of which are hereby incorporated by reference. In a certain multiport embodiment, the same measurements and calculations are made for each direct pair and indirect pair to yield directivity, source match and reflection tracking for the error adapter X related to the measurement port of the direct or indirect pair capable of connection to the first test channel receiver 111 and directivity, source match, and reflection tracking for the error adapter Y related to the measurement port of the direct or indirect pair capable of connection to the second test channel receiver 112. Accordingly, an N port DUT 100 has N(N−1)/2 different X and Y error adapters associated therewith. In another multiport embodiment, the disclosed measurements are made for all direct pairs to calculate directivity, source match, and reflection tracking and the error terms for the indirect pairs are calculated according to the '962 Patent Application.

Using the forward reflection and transmission measurements made on the locally terminated thru 601, which in a specific example of the first direct pair are the $A_{f13\_termthru}$, $B_{f13\_termthru}$, and $R1_{f13\_termthru}$ arrays, it is possible to solve for a load match error coefficient presented at the measurement port capable of connection to the second test channel receiver 112 and a forward transmission tracking error coefficient for the first direct pair. The load match for the measurement port $103_3$, $\Gamma_{L3}$, and forward transmission tracking for the first direct pair, $\tau_{13}$, are given by:

$$\Gamma_{L3} = \frac{Sx_{11} - (A_{f13\_termthru}/R1_{f13\_termthru})}{Sx_{11}Sx_{22} - Sx_{12}Sx_{21} - Sx_{22}(A_{f13\_termthru}/R1_{f13\_termthru})} \qquad (36)$$

and $$\tau_{13} = (B_{f13\_termthru}/R1_{f13\_termthru})(1 - Sx_{22}\Gamma_{L3}) \qquad (37)$$

Using the reverse reflection and transmission measurements made on the locally terminated thru 601, which in a specific example of the first direct pair are the $A_{r13\_termthru}$, $B_{r13\_termthru}$, and $R2_{f13\_termthru}$ arrays, it is possible to solve for a load match error coefficient presented at the measurement port capable of connection to the first test channel receiver 111 and a reverse transmission tracking error coefficient for the first direct pair. The load match for the measurement port $103_1$, $\Gamma_{L1}$, and the reverse transmission tracking coefficient, $\tau_{31}$, are given by:

$$\Gamma_{L1} = \frac{Sy_{11} - (B_{r13\_termthru}/R2_{r13\_termthru})}{Sy_{11}Sy_{22} - Sy_{12}Sy_{21} - Sy_{22}(B_{r13\_termthru}/R2_{r13\_termthru})} \qquad (38)$$

and $$\tau_{31} = (A_{r13\_termthru}/R2_{r13\_termthru})(1 - Sy_{22}\Gamma_{L1}) \qquad (39)$$

In the specific illustrated embodiment, using the measurements made of the locally terminated thru 601 for the second direct pair, the same algorithmic formulations shown in equations (36) through (39) as described for the first direct pair are applied to the measurement ports of the second direct pair. Accordingly, forward and reverse directivity, source match, reflection tracking and load match error coefficients for each measurement port in the direct and indirect pairs and forward and reverse transmission tracking error coefficients for all direct and indirect pairs are determined.

In a multiport embodiment of a method according to the teachings of the present invention, the forward and reverse directivity, forward and reverse source match, forward and reverse reflection tracking, forward and reverse load match, and forward and reverse transmission tracking error coefficients for each measurement port in all of the direct pairs are similarly determined.

Because the directivity, source match and reflection tracking are fully determinable, characteristics of the high reflect calibration standard 301 may also be calculated. Using equations (25) or (26) and solving for $\Gamma_{act\_reflect\_x}$ or $\Gamma_{act\_reflect\_y}$, yields:

$$\Gamma_{act\_reflect\_x} = \frac{B - \Gamma_{meas\_reflect\_x}}{(A - \Gamma_{meas\_reflect\_x})S_{x22}} \quad (40)$$

or $$\Gamma_{act\_reflect\_y} = \frac{D - \Gamma_{meas\_reflect\_y}}{(C - \Gamma_{meas\_reflect\_y})S_{y22}}$$

The argument of $\Gamma_{act\_reflect\_x}$ as a function of frequency, where 360 degrees is added as the function passes through the +/−180 degree points as previously described, is fitted to a least sum squared fitting algorithm with a two term polynomial as in equations (32) or (33). The resulting two term polynomial that describes the proper function includes $A_{0\_\Gamma act\_reflect\_x}$ as the y-intercept and $A_{1\_\Gamma act\_reflect\_x}$ as the slope. If $A_{0\_\Gamma act\_reflect\_x}$ has a value closest to 180 degrees, then the high reflect calibration standard 301 has a short circuit reflection coefficient. If $A_{0\_\Gamma act\_reflect\_x}$ has a value closest to 0 degrees, then the high reflect calibration standard 301 has an open circuit reflection coefficient. Accordingly, the type of high reflect calibration standard measured can be deduced from the least sum square fit calculations. If the electrical length of the thru 601 is unknown, however, it is necessary to know a phase offset of the high reflect calibration standard 301 for additional correction. If the electrical length of the thru is known, it is possible to determine a type of high reflect 301 and calculate the phase offset of the reflect 301.

The forward and reverse transmission tracking error coefficients of the proximal pairs are: $\tau_{12}, \tau_{21}, \tau_{34}$, and $\tau_{43}$, which may be determined either through measurement and calculation or through pure calculation. The method for pure calculation of the forward and reverse transmission tracking error coefficients is taught in U.S. patent application Ser. No. 10/098,040, the teachings of which are hereby incorporated by reference.

Figure 11:
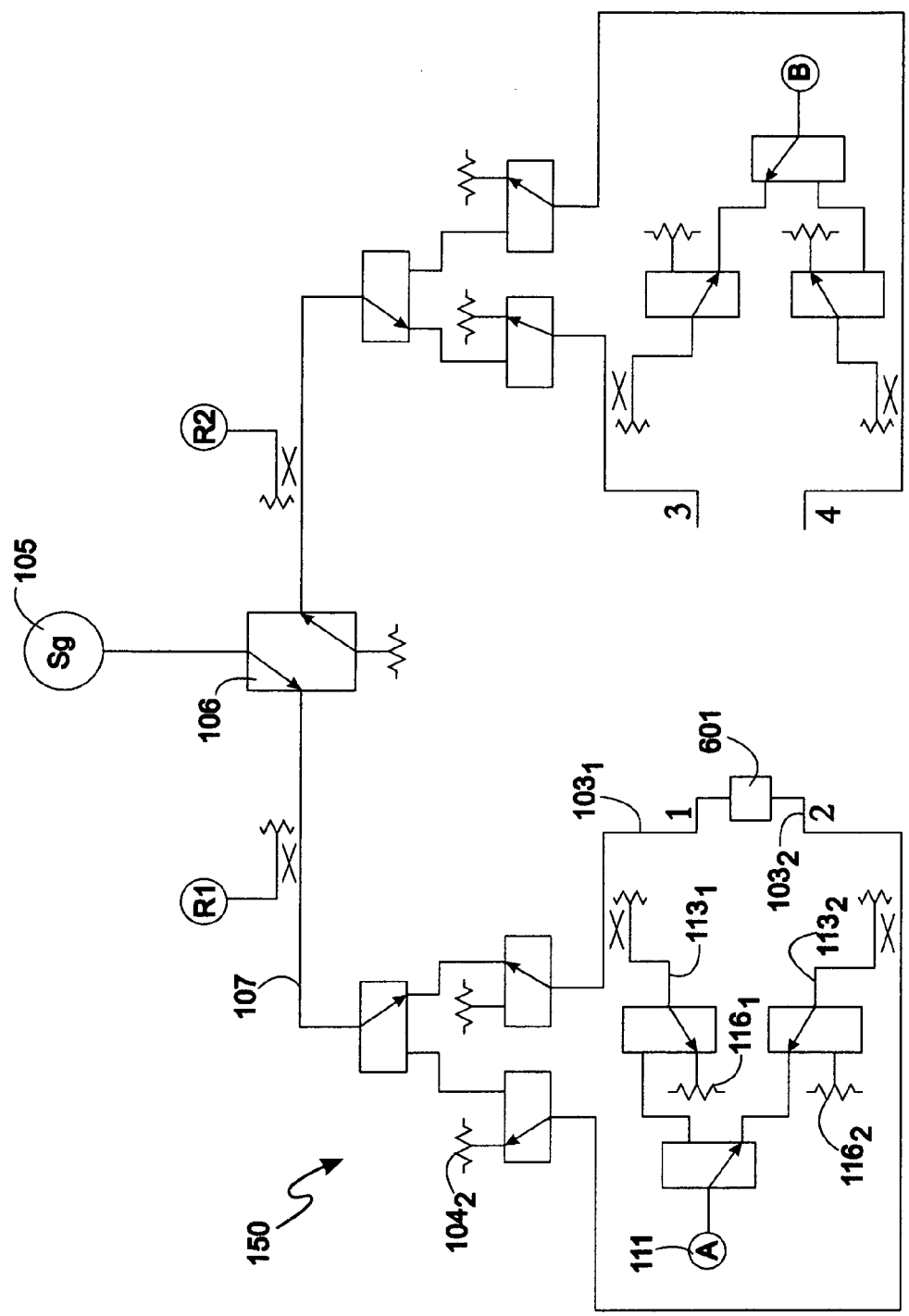
FIGS. 11 and 12 show an optional VNA measurement with a locally terminated thru calibration standard connected between one of the proximal pairs of measurement ports and respective switch network configurations for forward and reverse measurements.

Alternatively and with specific reference to FIG. 11 of the drawings, the forward transmission tracking error coefficient for each proximal pair where both measurement ports 103 of the proximal pair are capable of connection to the first test channel receiver 111 is measured and calculated by connecting the thru 601 between the measurement ports 103 of the proximal pair, connecting the signal generator 105 to a first one of the measurement ports 103 of the proximal pair and terminating the sampling arm 113 in a local terminating impedance 116. For purposes of nomenclature, the first measurement port 103 of the proximal pair is designated as "port F". The other measurement port 103 of the proximal pair, which for purposes of nomenclature is designated as "port G", is terminated in a local terminating impedance 104, and the respective sampling arm 113 is connected to the first test channel receiver 111. The VNA 200 measures and stores a ratio of a transmission response over the reference signal, $A_{fFG\_termthru}/R1_{fFG\_termthru}$. The ratio is used in the transmission tracking error coefficient equation where:

$$\tau_{FG} = (A_{fFG\_termthru}/R1_{fFG\_termthru})(1 - Sx_{22\_portF}\Gamma_{portF}) \quad (41)$$

The reverse transmission tracking error coefficient for the same proximal pair, ports F&G, where both measurement ports 103 of the proximal pair are capable of connection to the first test channel receiver 111 is measured and calculated by keeping the connection of the thru 601 between the measurement ports 103 of the proximal pair, connecting the signal generator 105 to the second one of the measurement ports 103 of the proximal pair and terminating the sampling arm 113 in a local terminating impedance 116. The first one of the measurement ports 103 of the proximal pair is terminated in the local terminating impedance 104, and the respective sampling arm 113 is connected to the first test channel receiver 111. The VNA 200 measures and stores a ratio of a transmission response over the reference signal, $A_{rFG\_termthru}/R1_{rFG\_termthru}$. The ratio is used in the transmission tracking error coefficient equation where:

$$\tau = (A_{rFG\_termthru}/R1_{rFG\_termthru})(1 - Sx_{22\_portG}\Gamma_{portG}) \quad (42)$$

For purposes of illustration and with specific reference to FIG. 11, there is shown connection diagrams for the determination of the forward and reverse transmission tracking error coefficients for the proximal pair comprising measurement ports 103$_1$ and 103$_2$. The forward transmission measurement is made by connecting the signal generator 105 to the first signal path 107. The switch network 150 is configured so that the first signal path 107 is connected to the measurement port 103$_1$ and the respective sampling arm 113$_1$ is terminated in the local sampling arm impedance 116$_1$. The switch network 150 is further configured so that the measurement port 103$_2$ is terminated in the local terminating impedance 104$_2$ and the sampling arm 113$_2$ is connected to the first test channel receiver 111. The signal generator 105 sweeps through the plurality of frequencies that define the desired frequency range and measures the ratio $A_{f12\_termthru}/R1_{f12\_termthru}$. Using equation (40) the forward transmission tracking error coefficient for the proximal pair is calculated as:

$$\tau_{12} = (A_{f12\_termthru}/R1_{f12\_termthru})(1 - Sx_{22\_port1}\Gamma_{port1})$$

Figure 12:
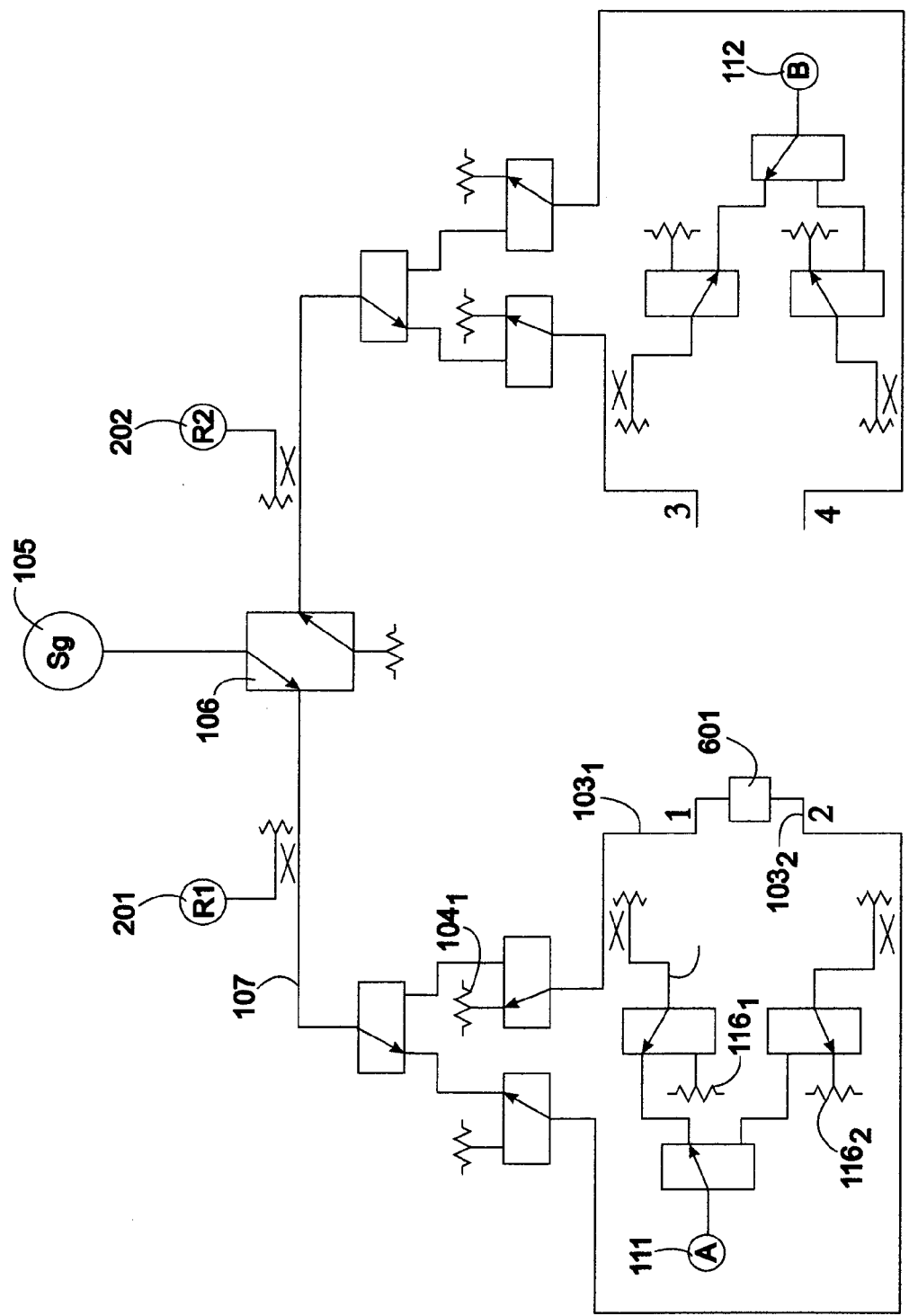

The connection of the thru 601 between the proximal pair and the signal transfer switch 106 configuration are maintained. With specific reference to FIG. 12 of the drawings, the switch network 150 is reconfigured so that the measurement port 103$_2$ is connected to the first signal path 107 and the respective sampling arm 113$_2$ is terminated in the local sampling terminating impedance 116$_2$. Additionally, the switch network 150 is configured so that the measurement port 103$_1$ is terminated in the local terminating impedance 104$_1$ and the sampling arm 113$_1$ is connected to the first test channel receiver 111. The signal generator 105 sweeps through the plurality of frequencies that define the desired frequency range and measures the ratio $A_{r12\_termthru}/R1_{r12\_termthru}$. Using equation (41) the reverse transmission tracking error coefficient for the proximal pair is calculated as:

$$\tau_{21} = (A_{r12\_termthru}/R1_{r12\_termthru})(1 - Sx_{22\_port2}\Gamma_{port2})$$

The same measurement and calculation process is repeated for the remaining proximal pairs, which in the illustrated embodiment is the proximal pair comprising measurement ports $103_3$ and $103_4$. As one of ordinary skill in the art appreciates, the measurements for the proximal pair capable of connection to the second test channel receiver 112 are carried out using the same process, but with the second test channel receiver 112 and the second reference channel 202 as measurement devices. In a multiport embodiment, the measurement and calculation process is repeated for all of the proximal pairs.

When all ten error coefficients are known for each direct, indirect, and proximal pair of measurement ports, the DUT is inserted and measured by the VNA. The resulting measured S-parameters for each direct and indirect pair of the inserted DUT are corrected according to the '511 patent to arrive at actual S-parameters for the DUT, $S_{act11}$, $S_{act22}$, $S_{act12}$, and $S_{act21}$ for each direct and indirect pair. U.S. patent application Ser. No. 09/954,962 (herein "the '962 patent Application"), the teachings of which are hereby incorporated by reference, teaches a process for accepting a plurality of actual S-parameter matrices, each actual S-parameter matrix representing one direct or indirect pair. Multiple direct and indirect pairs are used to represent a single multiple-port DUT. According to the teachings of the '962 Patent Application, the multiple actual S-parameters for the two-port devices that combine to represent the multi-port DUT are normalized to impedances presented to the measured ports by the multiport test set. The multiple S-parameter matrices are combined into a larger normalized single S-parameter matrix to represent the corrected and normalized S-parameters that represent the DUT as a whole. The larger S-parameter matrix is further normalized to a characteristic impedance, for example 50 ohms. For purposes of the remaining disclosure, the measured, corrected and normalized S-parameter matrix for the DUT is referred to as the matrix S.

Because the calibration process uses a non-zero thru calibration standard 601 and perhaps an offset high reflect calibration standard, a reference plane based upon the thru calibration standard 601, termed a "shifted calibration reference plane", is placed in the center of the electrical length representing the aggregate of the electrical lengths of any delay of the non-zero thru calibration standard 601 and any offset of the high reflect calibration standard 301. In on-wafer measurements, it is typical to have a zero offset high reflect calibration standard and an unknown non-zero thru calibration standard. For coaxial measurements, it is possible to calibrate with a zero delay thru and an offset high reflect. The teachings herein accommodate both situations as well as other combinations of thru and high reflect calibration standards not specifically mentioned. FIG. 6 of the drawings, illustrates a placement of the shifted calibration reference plane 701. The proper reference plane for measurement of the DUT, however, is a reference plane that is disposed at each measurement port that connects to the DUT, termed "the DUT reference plane". The DUT reference plane for port 1 is shown as 702 in FIG. 6 of the drawings. Each measurement port 103 has a respective and similarly situated DUT reference plane. In order to establish the DUT reference plane for all measurements, S-parameters for each direct and indirect pair are phase shifted. The amount of phase shift required for the S-parameters is calculated from a determination of the electrical length of the non-zero thru calibration standard. The mispositioning of the reference plane may be corrected by determining the electrical length of the combination of the thru 601 and the offset high reflect calibration standard 301 and adjusting respective measured and corrected S-parameters accordingly.

If the electrical length of the thru 601 is unknown and the offset of the high reflect 301 is known, the electrical length of the non-zero thru 601 between each direct and indirect pair, may be determined. Begin with the least sum squared fit (refer to equation (32) and accompanying text) of the measured reflection parameter $\Gamma_{act\_reflect\_x}$ as an example (refer to equation (40) and accompanying text) of the measurement port for the direct or indirect pair of interest. The slope of the function, $A_{1\_\Gamma act\_reflect\_x}$, represents a derivative of the argument of the high reflect calibration standard 301. The derivative of the argument defines a change in phase with respect to the corresponding change in frequency as a function of frequency or $$\frac{d\theta}{df}.$$

Any phase delay as a function of frequency that is measured when the high reflect calibration standard 301 is connected that cannot be attributed to the high reflect calibration standard offset can be attributed to the phase delay introduced into the measurement as a result of the calibration process using the non-zero thru 601. If the electrical length of the non-zero thru is known, then any phase delay that cannot be attributed to the thru calibration standard 601 can be attributed to the offset of the high reflect calibration standard 301. This phase delay attributable to the non-zero thru 601 and/or the offset reflect calibration standards, therefore, may be removed from the final DUT measurement when the electrical lengths are known. In the case of a zero offset high reflect standard, the phase shift of the high reflect standard 301 as a function of frequency is equal to the negative of the phase shift introduced by the non-zero thru 601. The aggregate electrical delay of the non-zero thru and the offset of the high reflect calibration standard, represented as T in seconds, is defined as:

$$T = -\frac{d\theta}{360\,df} \tag{43}$$

Accordingly, the electrical delay, T, as a function of frequency is expressed as:

$$T = \frac{1}{360}A_{1\_\Gamma act\_reflect\_x} \tag{44}$$

The electrical length, l, in centimeters is calculated from the electrical delay as a function of frequency where c is equal to $2.99793 \times 10^{10}$ or the speed of light in centimeters per second and:

$$l = cT \tag{45}$$

The process to determine the electrical length, l, of the aggregate offset from the non-zero thru 601 and/or offset high reflect is repeated for each one of the direct and indirect pairs. The electrical length may be calculated or measured for the indirect and proximal pairs. As a practical matter in the case of on-wafer measurements, even if the same on-wafer calibration standard is used, a different landing is made for each direct and indirect pair. Because the thru calibration measurement for each direct and indirect pair has a different landing, the electrical length of the thru calibration standard will be different for each direct and indirect pair. Accordingly, a different electrical length is maintained for each direct, indirect, and proximal pair.

In many cases, a thru 601 between proximal pairs is not commercially available on-wafer for use with differential probes. Accordingly, the electrical length of the on-wafer thru 601 for proximal pairs is calculated instead of measured for purely practical reasons. If an on-wafer thru calibration standard for use with differential probes were to become available, the electrical length between proximal pairs would be measured and calculated as it is for the direct and indirect pairs of measurement ports. Until then, the electrical length is calculated from an average of the direct and indirect pair having the proximal pair measurement ports in common.

In an embodiment where a thru 601 may be measured between proximal pairs, for example coaxial measurements, the electrical length of the thru 601 between proximal pairs may be measured and calculated as described for the direct and indirect pairs.

In an embodiment where it is not possible or practical to measures a thru 601 between proximal pairs, the electrical length of the thru calibration standard 601 is measured for the direct and indirect pairs. The electrical length of each proximal pair is then calculated from an average of the direct pair and the indirect pair having only one port in common. As an example, the electrical length of the thru 601 between ports 3 and 4 is the average of the electrical length of the thru calibration standards between ports 1 and 3 and between ports 1 and 4.

For purposes of nomenclature, electrical length is represented as "l" with a subscript that represents the two ports to which it applies. Accordingly, the electrical length between measurement ports $103_1$ and $103_3$ is represented as "$l_{13}$". In the illustrated four port DUT, electrical length is determined for all thru calibration standards yielding $l_{13}$, $l_{24}$, $l_{14}$, and $l_{23}$ electrical lengths for the thrus 601 measured between the direct and indirect pairs. The electrical length calculation of the two remaining proximal pairs yields $l_{12}$ and $l_{34}$.

In order to make the appropriate calculations to yield the electrical length of the direct and indirect pairs, the measurements made for the source terminated thru are used. Specifically, for the thru 601 measured between measurement ports $103_1$ and $103_3$, the measurement arrays $A_{f13\_thru}$, $R1_{f13\_thru}$, $B_{f13\_thru}$, $R2_{f13\_thru}$, $A_{r13\_thru}$, $R1_{r13\_thru}$, $B_{r13\_thru}$, and $R2_{r13\_thru}$ are used to calculate the $\Gamma_{act\_reflect\_x}$ term for the first direct pair. The $\Gamma_{act\_reflect\_x}$ is used to obtain the $A_{1\Gamma\_act\_reflect\_x}$ term from equation (32) or (33) to make the electrical length determination from equations (41)–(43). A similar calculation is made for all direct and indirect pairs of the multiport configuration to determine the electrical length of each combination of the thru calibration standard 601 and offset reflect.

The elements of the matrix S are phase shifted according to the measured electrical length of the specific thru 601 and high reflect 301 used in the calibration process to correct the mispositioning of the calibration reference plane. For example, in a four port DUT embodiment, the electrical length $l_{13}$ is used to correct parameters $S_{11}$, $S_{13}$, $S_{31}$, and $S_{33}$. Similarly the electrical length $l_{24}$ is used to correct parameters $S_{22}$, $S_{24}$, $S_{42}$, and $S_{44}$, electrical length $l_{14}$ is used to correct parameters $S_{14}$, and $S_{41}$, electrical length $l_{23}$ is used to correct parameters $S_{23}$, and $S_{32}$, electrical length $l_{12}$ is used to correct parameters $S_{12}$, and $S_{21}$, and electrical length $l_{34}$ is used to correct parameters $S_{34}$, and $S_{43}$. It is assumed that the same high reflect calibration standard 301 is used for all measurement ports 103.

In a currently preferred method, the resulting measured, corrected, and normalized S-parameters are adjusted at each frequency. If the unrotated S-parameter is represented as a general complex parameter, then:

$$S = |\rho| e^{-j\Theta_0} \qquad (46)$$

where $\Theta_0$ is the phase of the corrected and unrotated S-parameter. The $\Theta$ term may be represented as a component of measured phase attributable to the measured DUT, $\Theta_{dut}$, and a component of measured phase attributable to the shifted reference plane, $\delta\Theta$, where:

$$\Theta_{dut} = \Theta_0 + \delta\Theta \qquad (47)$$

The length, l, in centimeters is then used to calculate phase shift attributable to the non-zero thru calibration standard 601 and high reflect standard as a function frequency, f, in GHz where:

$$\delta\Theta(f) = -12.0083 fl \qquad (48)$$

where $\delta\Theta$ is determined as a function of frequency for each electrical length represents the phase rotation attributable to the reference plane shift. When the electrical length and, therefore, the phase shift attributable to the sum of the electrical delay of the non-zero thru calibration standard plus any offset in the high reflect standard as a function of frequency for each two-port combination is known from equation (49), the corrected and unrotated S-parameters may be adjusted as a function of frequency of the reference plane for each S-parameter.

Accordingly, phase corrected S-parameters are calculated as a function of frequency where:

$$S_{dut} = |\rho| e^{-j(\Theta_0 + \delta\Theta(f))} \qquad (49)$$

The resulting s-parameters in the $S_{dut}$ matrix represents measured, corrected and normalized S-parameters for the measured DUT where the measurement reference plane has been correctly placed at the DUT measurement reference plane 702.

In an alternative embodiment of an electrical length calculation for a TRL calibration process, forward and reverse measurements of the high reflect 301, line 501 and optional matched loads, and source terminated thru 601 calibration standards are taken for just the direct pairs. Directivity, reflection tracking and source match as well as electrical length of the thru 601 plus any offset high reflect 301 is measured and calculated for the direct pairs of measurement ports 103. Forward and reverse measurements of the locally terminated thru calibration standard 601 are then taken for just the direct and indirect pairs of measurement ports and calculated as taught herein. Alternatively, only the direct pair is measured and transmission tracking and load match may be calculated for the indirect and proximal pairs from the teachings of the '040 Patent Application. Optionally, forward and reverse measurements of the locally terminated thru 601 may be taken for calculation of transmission tracking and load match according to the teachings herein. The S-parameters of the DUT are measured, corrected and normalized according to the teachings herein. From the error terms, the electrical length of the thru plus any offset high reflect may be calculated for the indirect and proximal pairs as follows where "n" is a first port and "m" is a second port. Begin with the relationships:

$$\Gamma_{SM\_portn} = EDF_{portn} + \frac{ERF_{portn}\Gamma_{SA\_portn}}{1 - ESF_{portn}\Gamma_{SA\_portn}} \quad (50)$$

where $\Gamma_{SM\_portn}$ is the measured source match for port "n", $\Gamma_{SA\_portn}$ is the actual source match for port "n", and $EDF_{portn}$, $ERF_{portn}$, $ESF_{portn}$ are the calculated error coefficients for port "n" and:

$$\Gamma_{SA\_portn} = S_{11\_thru\_nm} + \frac{S_{21\_thru\_nm}S_{12\_thru\_nm}\Gamma_{LA\_portm}}{1 - S_{22\_thru\_nm}\Gamma_{LA\_portm}} \quad (51)$$

where $\Gamma_{LA\_portm}$ is the actual load match for port "m" and $S_{11\_thru\_nm}$, $S_{21\_thru\_nm}$, $S_{12\_thru\_nm}$ and $S_{22\_thru\_nm}$ are the measured S-parameters of the source terminated thru calibration standard 601. Because the thru calibration standard 601 is defined as having a perfect match, equation (51) reduces to:

$$\Gamma_{SA\_portn} = 0 + \frac{S_{21\_thru\_nm}S_{12\_thru\_nm}\Gamma_{LA\_portm}}{1 - 0} \quad (52)$$
$$= S_{21\_thru\_nm}S_{12\_thru\_nm}\Gamma_{LA\_portm}$$

and $$\frac{\Gamma_{SA\_portn}}{\Gamma_{LA\_portm}} = S_{21\_thru\_nm}S_{12\_thru\_nm} \quad (53)$$

Because $S_{21\_thru\_nm} = S_{12\_thru\_nm}$, there are two possible solutions. Fitting the argument of the square root of $S_{21\_thru\_nm}$ to a straight line using a least sum squared fit and equation (32) or (33), the solution with a y-intercept closest to zero is the correct solution and the resulting argument of the correct solution is the length of the electrical delay between the two proximal pair measurement ports. This length is used to correct for the shifted reference plane according to equations (46)–(49) and the accompanying text.

With specific reference to FIGS. 13 through 17 of the drawings, there is shown a flow chart of an embodiment of a method according to the present teachings in which measurements for the direct and indirect pairs of measurement ports 103 are taken for the high reflect calibration standard 301, the line calibration standard 401, the source terminated thru calibration standard 601 and the locally terminated thru calibration standard 601. A measurement of the locally terminated thru calibration standard 601 is taken for each proximal pairs of the measurement ports 103. The high reflect calibration standard 301 is connected 1301 to a measurement port 103 and the switch network 150 is configured for measurement 1302 by the VNA 200 of a ratio of the reflection response over the stimulus. See FIG. 2 of the drawings. The ratio yields a value for a reflection ratio for a number of frequencies in a desired frequency range. The numbers are stored in a data array where each element of the data array holds the measured ratio at a single frequency. The reflect calibration standard 301 is then disconnected and reconnected 1303 to a next measurement port, the switch network 150 is reconfigured, and similar measurements are made and stored in respective data arrays. The process continues for each measurement port 103 of the VNA 200.

In a preferred embodiment, the desired frequency range for which all measurements are taken is the same. In this case, each element in the data arrays represents measured results at the same frequency point along the desired frequency range.

Figure 13:
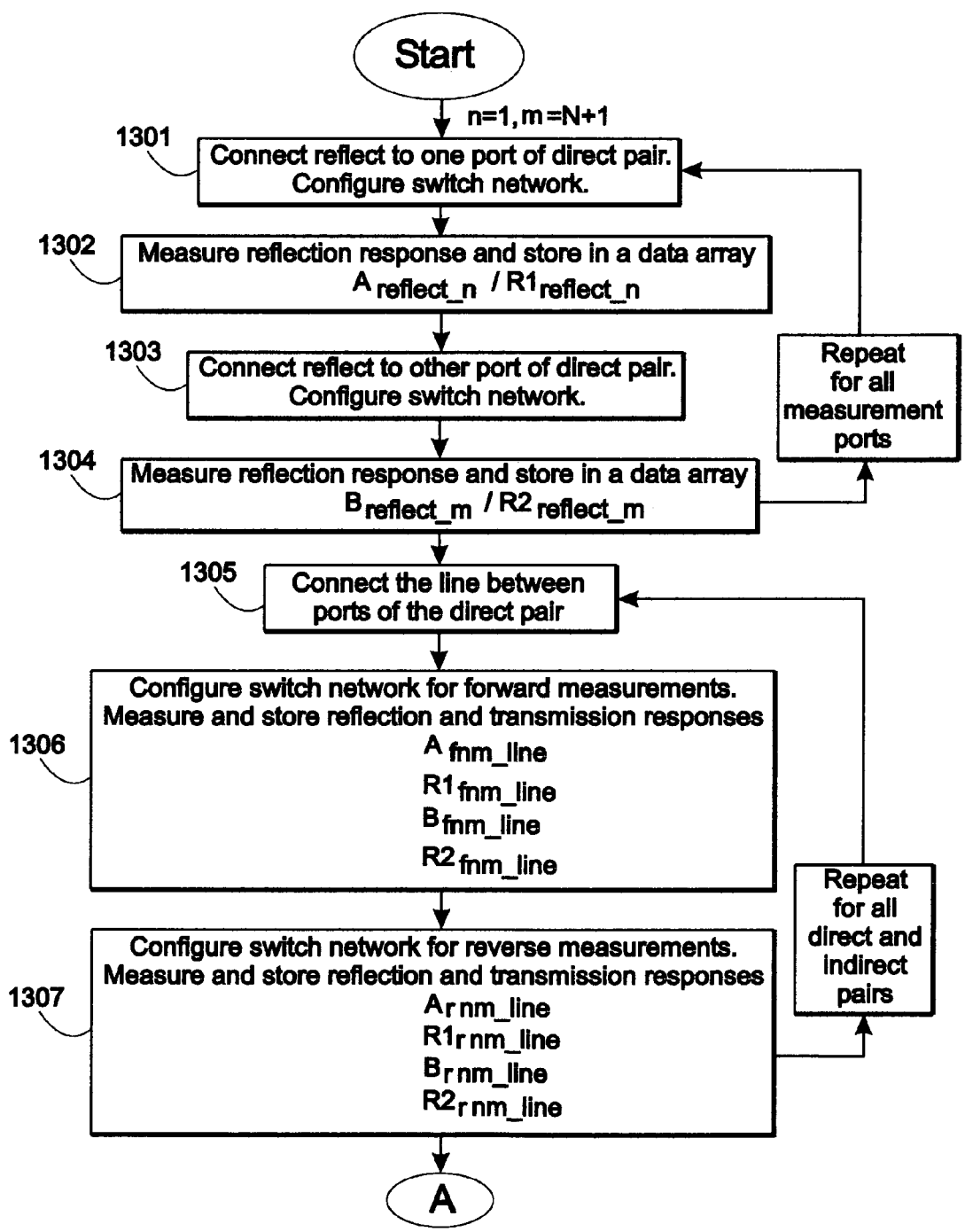
FIGS. 13 through 18 is a flow chart of a method for calibrating and correcting S-parameters of a measured DUT according to the present teachings.

The flow chart of FIG. 13 continues with the step of connecting 1305 and configuring 1306 the switch network 150 for termination of the line 401 at the source 109 and measurement of the line calibration standard 401 between a first direct or indirect pair. The VNA 200 measures 1306 a forward direction reflection and transmission response at the measurement ports 103 of the direct or indirect pair at the first and second test channel receivers 111, 112 as well as the first and second reference channels 201, 202. The switch network 150 is then reconfigured 1307 for the reverse direction measurement and the VNA 200 then measures 1307 a reverse direction reflection and transmission response at the measurement ports 103 of the direct pair at the first and second test channel receivers 111, 112 as well as the first and second reference channels 201, 202. Not shown in the flow chart is the connection and measurement of the matched loads 501 as shown in FIG. 6 of the drawings to extend the calibration to the lower frequency range. A measurement of the line 401 calibration standard is performed for each direct and indirect pair.

Figure 14:
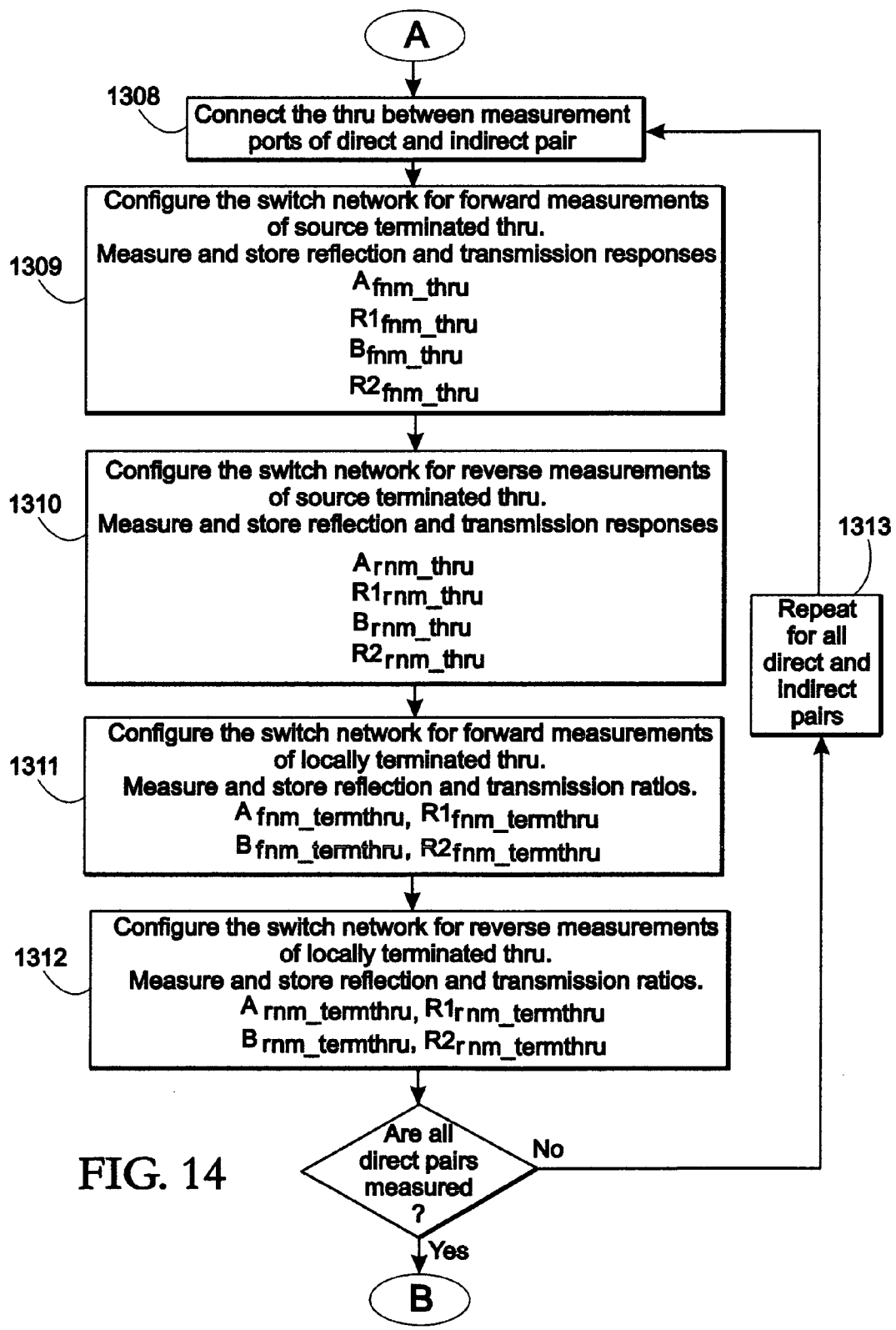

With specific reference to FIG. 14 of the drawings, the flow chart continues with the step of connecting 1308 the thru 601 to a first direct pair of measurement ports 103. The switch network 150 is configured 1309 for forward direction measurement of the thru 601 with a termination at the source 109, and the forward direction reflection and transmission responses and the reference channel signals are measured and stored in data arrays. The switch network 150 is then reconfigured 1310 for the reverse direction measurements with the thru 601 terminated at the source 109 and the reverse direction reflection and transmission responses and the reference channel signals are measured and stored in data arrays.

The thru 601 remains connected and the switch network 150 is reconfigured 1311 for a forward direction measurement, where the thru 601 is locally terminated in a local impedance 104 within the switch network 150. The forward direction reflection and transmission responses of the locally terminated thru 601 are measured and stored as well as the reference channel signals. The switch network 150 is then reconfigured 1312 for a reverse direction measurement of the locally terminated thru 601, the reverse reflection and transmission responses and the reference channel signals are measured and stored. The process repeats 1313 for all N/2 direct pairs and N(N−2)/4 indirect pairs of measurement ports 103 for an N port DUT.

At this point in the process, there is sufficient information to calculate an electrical length of the aggregate thru/offset reflect between direct and indirect pairs of measurement ports 103 used in the calibration process. For purposes of process, however, all calculations are made after all measurements are taken.

Figure 15:
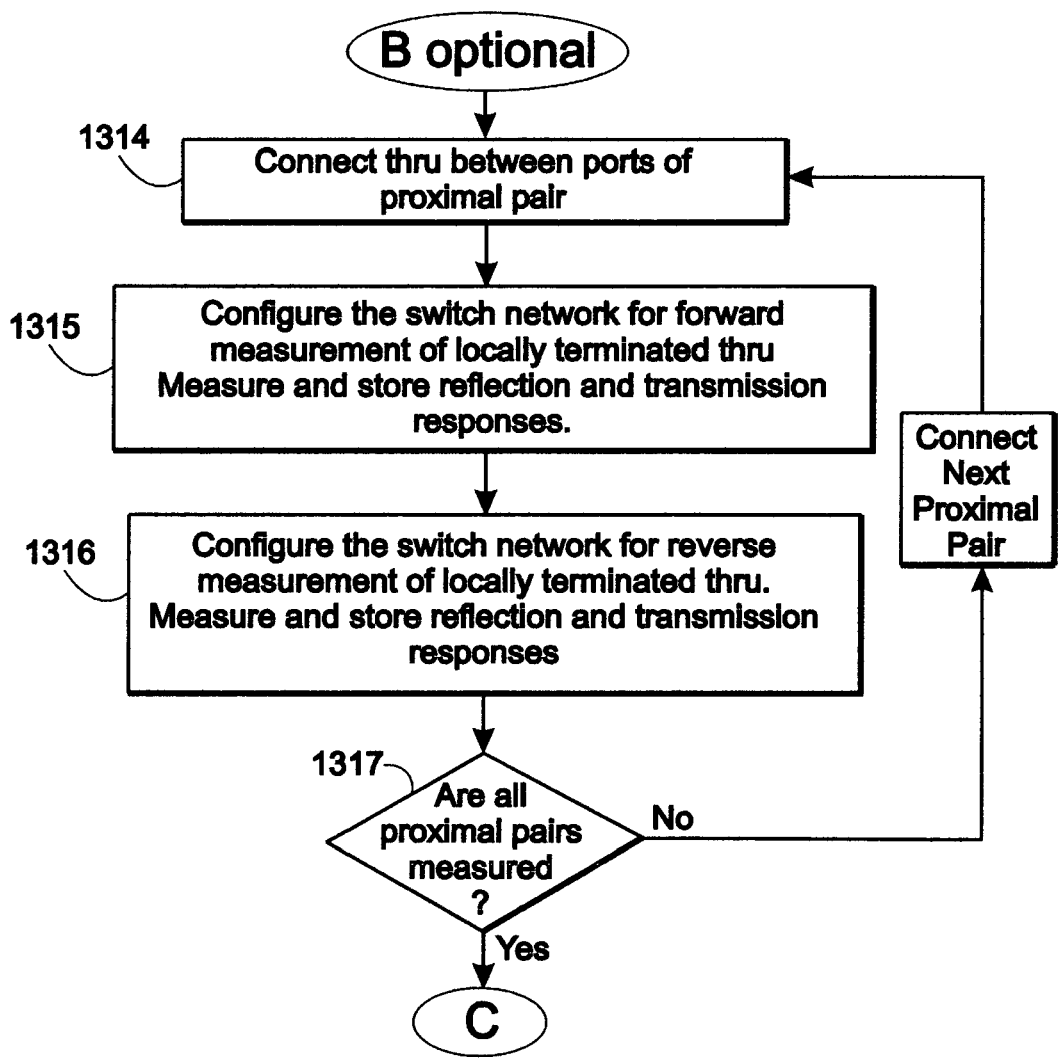

With specific reference to FIG. 15, there is shown an optional portion of the measurement process wherein forward and reverse measurements of the locally terminated thru calibration standard 601 is taken between each proximal pair of measurement ports 103. A user connects the thru 601 between one of the proximal pairs 1314. The switch network 150 is then configured 1315 for a forward measurement of the locally terminated thru, measurements are taken and stored. The switch network 150 is then configured 1316 for the reverse measurement of the locally terminated thru 601, measurements are taken and stored. The process repeats 1317 for each N(N−2)/4 proximal pairs.

Figure 16:
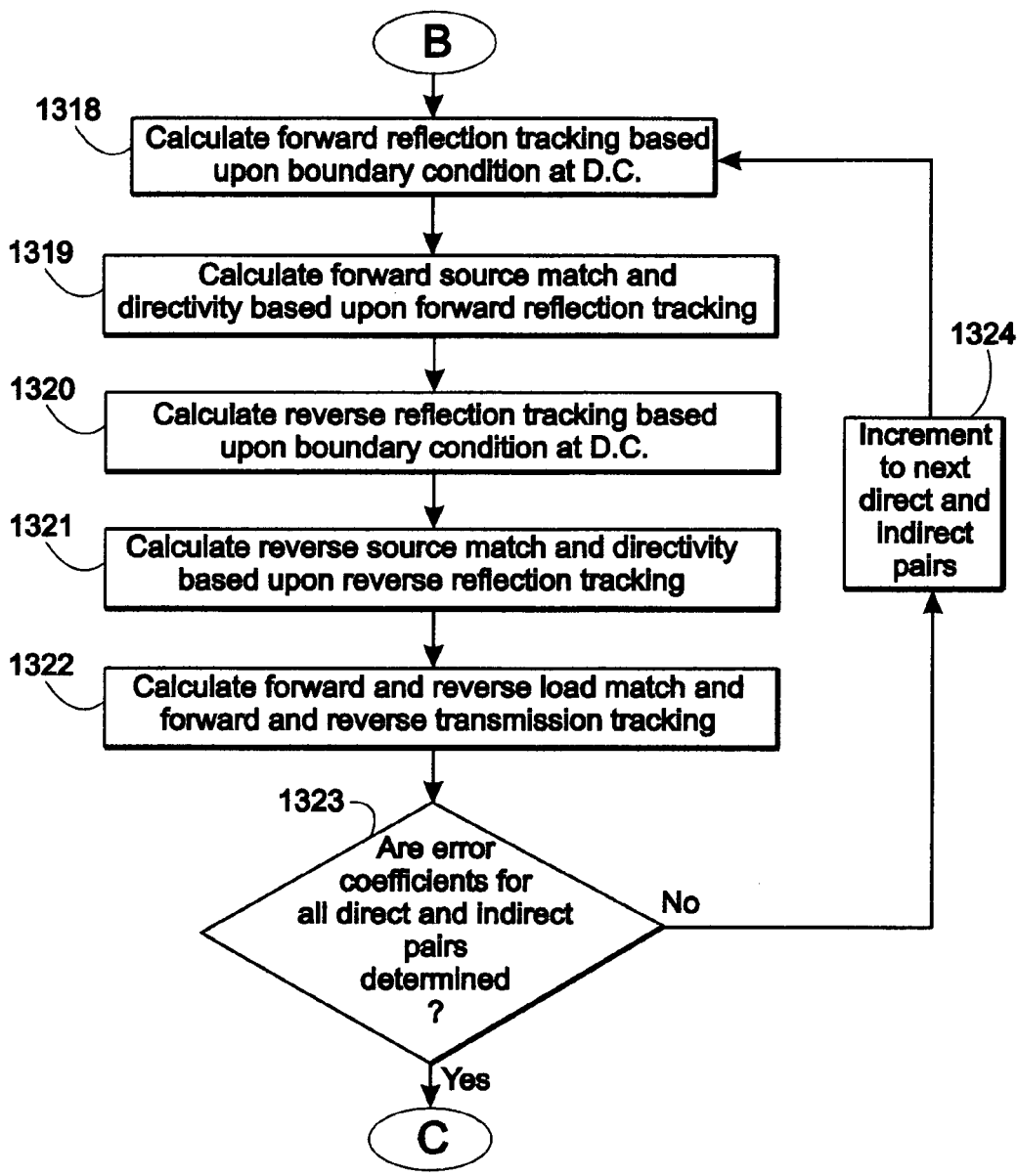

With specific reference to FIG. 16 of the drawings, the flow chart continues with the steps of calculating 1318 a forward reflection tracking error coefficient 1903 based upon a boundary condition at DC and using the forward reflection tracking error coefficient result, calculating 1319 a forward source match 1902 and forward directivity 1901 error coefficients. The reverse reflection tracking error coefficient 1920 is calculated 1320 also based upon a boundary condition at DC. Using the reverse reflection tracking error coefficient 1906 result, the reverse directivity 1904 and reverse source match 1905 are determined 1321. The method then determines 1322 the forward and reverse load match and the forward and reverse transmission tracking error coefficient to arrive at ten error terms based upon the TRL calibration. All ten error terms are determined for all direct and indirect pairs in a loop 1323 that increments 1324 through the plurality of two-port measurements.

Figure 17:
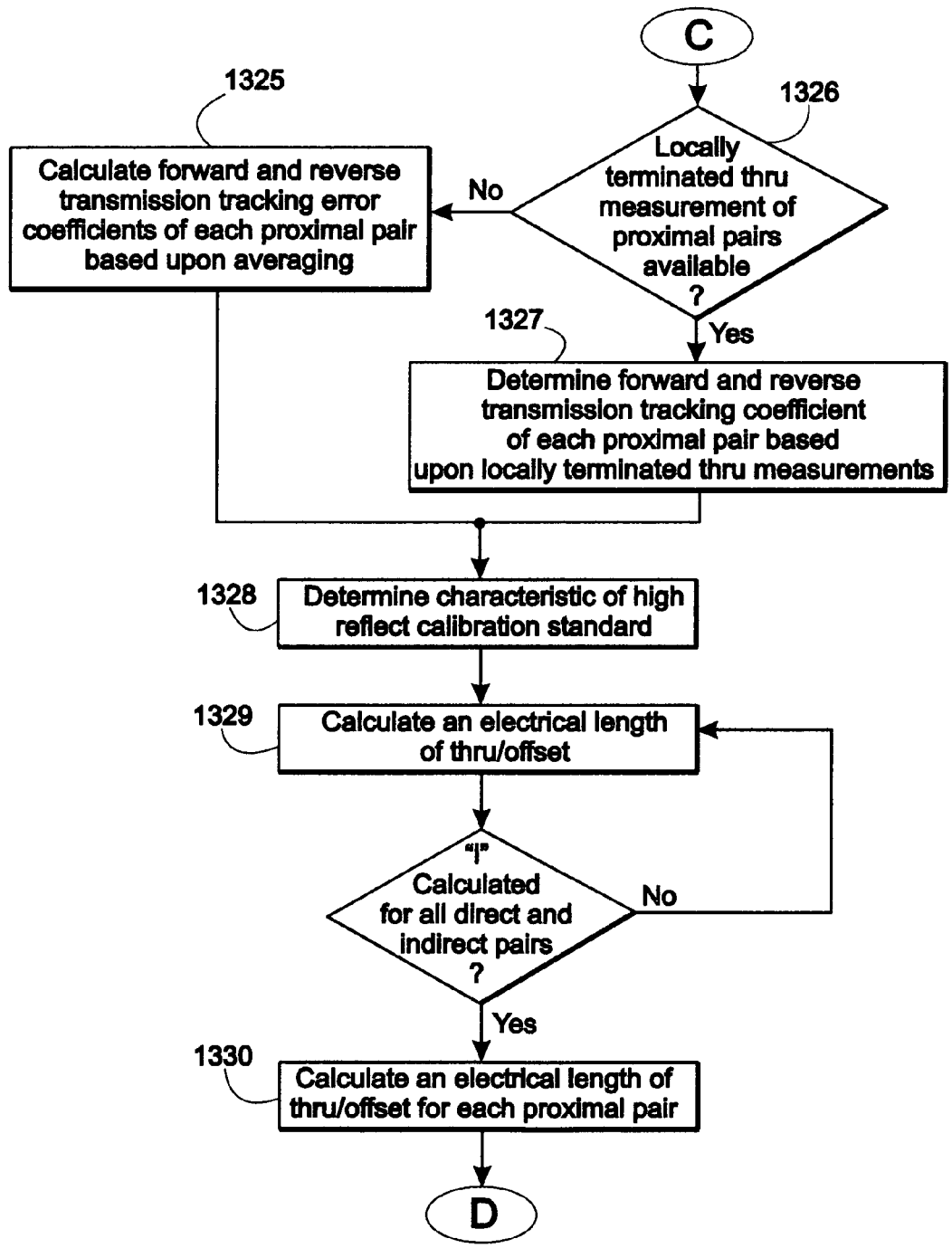

With specific reference to FIG. 17 of the drawings, the process continues with optional process paths shown as alternative paths on the flow chart. In one embodiment, the forward and reverse transmission tracking error coefficients for each proximal pair are calculated 1325 according to the teachings of the '040 Patent Application. In an alternate embodiment, if the locally terminated thru 601 is measured 1326 between each proximal pair of measurement ports 103. The forward and reverse transmission tracking coefficient of each proximal pair are determined 1327 from the measurements made. When the transmission tracking error coefficients are determined for each proximal pair of measurement ports 103, the process continues with the steps of determining 1328 a type of high reflect calibration standard 301 used in the calibration process and calculating 1329 an electrical length of each thru calibration standard 601 used in the calibration process between each direct and indirect pair. An electrical length is then typically calculated 1330 for each proximal pair based upon an average of the electrical length between direct and indirect pairs having a single common measurement port. If and when it is practical to measure a source terminated thru 601 between proximal pairs, the electrical length may be calculated as for the direct pairs.

Figure 18:
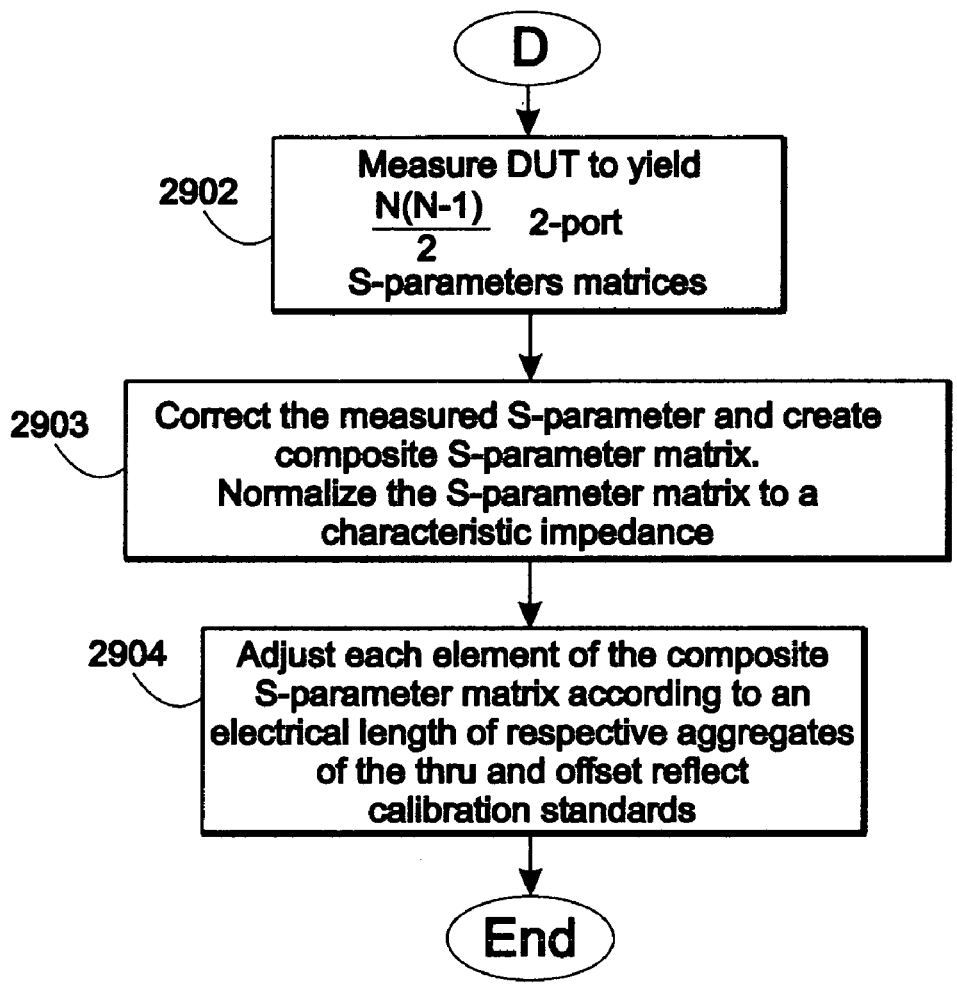

With specific reference to FIG. 18 of the drawings, when all of the systematic error coefficients are determined, the DUT 101 is inserted for measurement 2902 to yield N(N−1)/2 2-port S-parameter matrices to represent an N port DUT. The measured DUT data is then corrected 2903 according to the teachings of the '511 Patent. As also taught in the '511 patent, the corrected S-parameters matrices representing the plurality of 2-port devices are combined to yield an N×N S-parameter matrix that is corrected for the systematic errors of the VNA. The corrected S-parameter matrix is then normalized to a characteristic impedance.

Figure 19:
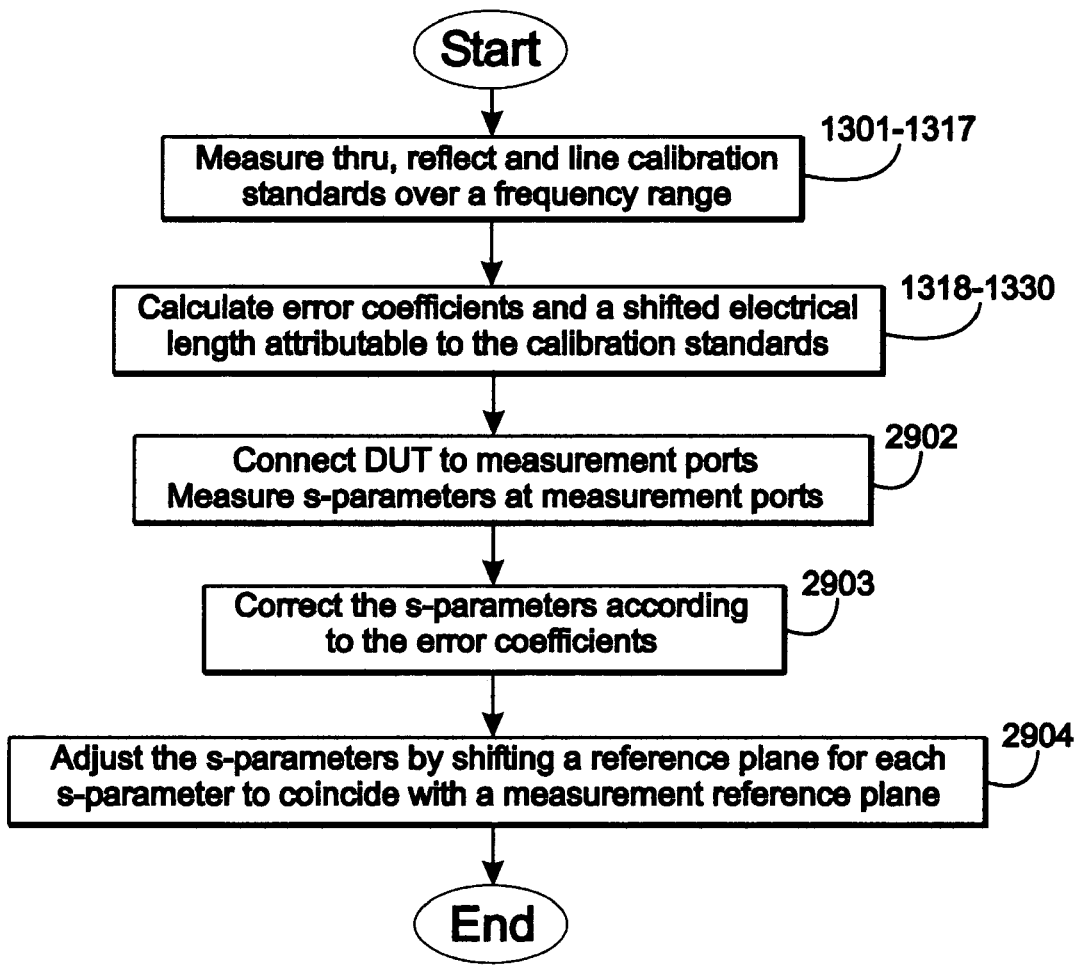
FIG. 19 is a flow chart of a method according to the present teachings.

With specific reference to FIG. 19 of the drawings, there is shown a flow chart illustrating a high level view of a method according to the present teachings that consolidates some of the steps detailed in FIGS. 13–18 and using the same reference numbers for similar steps.

Using the respective electrical length determined for each thru 601 the N×N corrected and normalized S-parameters of the measured DUT are further corrected by shifting the reference plane from the shifted calibration reference plane 601 to the DUT reference plane 702 as a function of frequency. The reference plane shift operation yields a N×N $S_{final}$ matrix, which represents the S-parameters for only the DUT after all corrections are made.

In yet another alternative embodiment of a process according to the present teachings, reflection measurements for all measurement ports are taken, and measurements are taken for the line and the source terminated thru for the direct pairs only. At this point in the process, it is possible to calculate electrical length for the thru/offset between the direct pairs. Additional measurements of the locally terminated thru 601 are taken for the direct and indirect pairs of measurement ports 103. The transmission tracking and load match coefficients may be calculated from the terminated thru measurements. The characteristics of the high reflect standard are determined and the electrical length for the indirect pairs is calculated based upon equations (50)–(53). The electrical length for the proximal pairs may then be calculated based upon the average of the direct and indirect pair having a common port. All error coefficients and electrical lengths being determined, the DUT is measured, corrected, normalized and a reference plane is shifted to a DUT reference plane as appropriate based upon the respective electrical lengths.

A method according to the present teachings may be performed by a computer with access to measured S-parameter characterization data for the thru-reflect-line calibration standards as well as the S-parameter characterization data for the DUT. The VNA performs the measurements and either stores the resulting data arrays on removable media or may be connected to a computer via a communications bus for storage on some other form of storage media. A method according to the present teachings may also be performed by the computational processor that is typically part of the VNA. Specifically, it is not necessary to know the type of high reflect calibration standard 301 used in the calibration process and it is not necessary to know the electrical length of the thru calibration standard 601. If a phase offset of a reflect calibration standard is known, a method according to the present teachings is able to measure and calculate the electrical length of the thru calibration standard 601 rather than relying on manufacturer's data. If the electrical length of the thru calibration standard is known, a method according to the present teachings calculates the phase offset of the reflect calibration standard. The calculated electrical length or phase offset is more accurate that manufacturer supplied data and, therefore, provides for a more accurate calculation of the error artifacts for correction of measured data. This is especially advantageous when calibrating for on-wafer measurements where a repeatable thru calibration standard is difficult to obtain and when using a calibration standard having characteristics that may have changed slightly due to environmental conditions and repeated use. In addition, the present teachings recognize that calibration using a non-zero thru places a transmission reference plane at a position different from the reflection measurements. A method or apparatus according to the present teachings is able to calculate the error attributable to use of a non-repeatable and non-zero thru. The method or apparatus according to the present teachings is also able to make further corrections to what was considered corrected data in the prior art to place the transmission measurement reference plane at a same point as a position of the reflection measurement reference plane. The more accurate thru calibration standard combined with the additional correction for the shifted measurement reference plane provides a more accurate measurement of the frequency response attributable to only the device under test and not the connection environment with which the device under test is connected to the measurement equipment.

The invention claimed is:

1. A method of measuring a DUT comprising the steps of:
providing a vector network analyzer having at least two measurement ports,
measuring a reflection characteristic of a high reflect calibration standard at each measurement port,
measuring forward and reverse reflection and transmission characteristics of a line calibration standard,
measuring forward and reverse reflection and transmission characteristics of a source terminated thru calibration standard,
measuring forward and reverse reflection and transmission characteristics of a locally terminated thru calibration standard,
calculating error coefficients for said at least two measurement ports based upon results in said steps of measuring,
calculating a shifted electrical length attributable to said calibration standards based upon results in said steps of measuring,
connecting the DUT to the measurement ports,
measuring s-parameters at the measurement ports,
correcting for systematic errors in said s-parameters based upon said error coefficients to yield a corrected S-parameter matrix, and
shifting a reference plane for each element of said corrected S-parameter matrix to coincide with a measurement reference plane
wherein a shifted electrical length between said indirect pairs is calculated using load match and source match error coefficient terms, and $$\frac{\Gamma_{SA\_portn}}{\Gamma_{LA\_portm}} = S_{21\_thru\_nm} S_{12\_thru\_nm}$$

wherein $S_{21\_thru\_nm}$ is equal to $S_{12\_thru\_mn}$ and an argument of both solutions for $S_{21\_thru\_nm}$ is fit to a straight line, the solution having a y-intercept closest to zero being a correct solution and a resulting argument of the correct solution being the electrical delay.

2. A method of measuring a DUT comprising the steps of:
providing a vector network analyzer having at least two measurement ports,
measuring a reflection characteristic of a high reflect calibration standard at each measurement port,
measuring forward and reverse reflection and transmission characteristics of a line calibration standard,
measuring forward and reverse reflection and transmission characteristics of a source terminated thru calibration standard,
measuring forward and reverse reflection and transmission characteristics of a locally terminated thru calibration standard,
calculating error coefficients for said at least two measurement ports based upon results in said steps of measuring,
calculating a shifted electrical length attributable to said calibration standards based upon results in said steps of measuring,
connecting the DUT to the measurement ports,
measuring s-parameters at the measurement ports,
correcting for systematic errors in said s-parameters based upon said error coefficients to yield a corrected S-parameter matrix, and
shifting a reference plane for each element of said corrected S-parameter matrix to coincide with a measurement reference plane,
measuring forward and reverse reflection and transmission characteristics of a source terminated thru calibration standard for indirect pairs of said measurement ports,
wherein the step of calculating further comprises calculating a different respective shifted electrical length for each said direct and indirect pair, and
wherein said shifted electrical length between proximal pairs is determined by averaging a shifted electrical length between said direct pair and said indirect pair having respective proximal pair measurement ports in common.

3. A method of measuring a DUT comprising the steps of:
providing a vector network analyzer having at least two measurement ports,
measuring a reflection characteristic of a high reflect calibration standard at each measurement port,
measuring forward and reverse reflection and transmission characteristics of a line calibration standard,
measuring forward and reverse reflection and transmission characteristics of a source terminated thru calibration standard,
measuring forward and reverse reflection and transmission characteristics of a locally terminated thru calibration standard,
calculating error coefficients for said at least two measurement ports based upon results in said steps of measuring,
calculating a shifted electrical length attributable to said calibration standards based upon results in said steps of measuring,
connecting the DUT to the measurement ports, measuring s-parameters at the measurement ports,
correcting for systematic errors in said s-parameters based upon said error coefficients to yield a corrected S-parameter matrix, and
shifting a reference plane for each element of said corrected S-parameter matrix to coincide with a measurement reference plane, and
determining a type of high reflect calibration standard, comprising
calculating a characteristic of said high reflect calibration standard, fitting arguments of two possible solutions for said characteristics to a straight line, identifying a solution closest to zero phase at DC.

4. A method of measuring a DUT comprising the steps of:
providing a vector network analyzer having more than two measurement ports,
measuring a reflection characteristic of a high reflect calibration standard at each measurement port,
measuring forward and reverse reflection and transmission characteristics of a line calibration standard for direct pairs of the measurement ports,
measuring forward and reverse reflection and transmission characteristics of a source terminated thru calibration standard for indirect pairs of the measurement ports,
measuring forward and reverse reflection and transmission characteristics of a locally terminated thru calibration standard for the indirect pairs,
calculating error coefficients for said at least two measurement ports based upon results in said steps of measuring, calculating a shifted electrical length attributable to said calibration standards based upon results in said steps of measuring for each direct and indirect pair, connecting the DUT to the measurement ports, measuring s-parameters at the measurement ports, correcting for systematic errors in said s-parameters based upon said error coefficients to yield a corrected S-parameter matrix, and shifting a reference plane for each element of said corrected S-parameter matrix to coincide with a measurement reference plane comprising modifying an argument of respective S-parameters according to respective ones of the shifted electrical lengths comprising adjusting each element of said corrected S-parameter matrix according to:

$$S_{dut} = |\rho|e^{-j(\theta_0 + \delta\theta(f))}$$

wherein $\delta\theta$ is calculated from said electrical length as a function of frequency.

5. A method of measuring a DUT comprising the steps of:

providing a vector network analyzer having at least two measurement ports, measuring a reflection characteristic of a high reflect calibration standard at each measurement port, measuring forward and reverse reflection and transmission characteristics of a line calibration standard, measuring forward and reverse reflection and transmission characteristics of a source terminated thru calibration standard, measuring forward and reverse reflection and transmission characteristics of a locally terminated thru calibration standard, calculating error coefficients for said at least two measurement ports based upon results in said steps of measuring, calculating a shifted electrical length attributable to said calibration standards based upon results in said steps of measuring by calculating a characteristic of said high reflect calibration standard, fitting an argument of said characteristic to a straight line, and using a slope of said straight line to calculate a shifted electrical length, connecting the DUT to the measurement ports, measuring s-parameters at the measurement ports, correcting for systematic errors in said s-parameters based upon said error coefficients to yield a corrected S-parameter matrix, and shifting a reference plane for each element of said corrected S-parameter matrix to coincide with a measurement reference plane.

* * * * *